United States Patent
Chang et al.

(10) Patent No.: US 12,422,481 B2
(45) Date of Patent: *Sep. 23, 2025

(54) SEMICONDUCTOR CHIP AND SEQUENCE CHECKING CIRCUIT

(71) Applicants: GLOBAL UNICHIP CORPORATION, Hsinchu (TW); TAIWAN SEMICONDUCTOR MANUFACTURING COMPANY, LTD., Hsinchu (TW)

(72) Inventors: Hung-Yi Chang, Hsinchu (TW); Bi-Yang Li, Hsinchu (TW); Shih-Cheng Kao, Hsinchu (TW)

(73) Assignees: GLOBAL UNICHIP CORPORATION, Hsinchu (TW); TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 249 days.

This patent is subject to a terminal disclaimer.

(21) Appl. No.: 18/190,144

(22) Filed: Mar. 27, 2023

(65) Prior Publication Data

US 2024/0110978 A1   Apr. 4, 2024

(30) Foreign Application Priority Data

Sep. 30, 2022   (TW) .................. 111137371

(51) Int. Cl.
*G11C 19/00* (2006.01)
*G01R 31/3185* (2006.01)
(Continued)

(52) U.S. Cl.
CPC ...... *G01R 31/318525* (2013.01); *G11C 19/00* (2013.01); *H03K 3/037* (2013.01); *H03K 19/21* (2013.01); *H10B 80/00* (2023.02)

(58) Field of Classification Search
CPC ..................................................... G11C 29/38
See application file for complete search history.

(56) References Cited

U.S. PATENT DOCUMENTS 6,690,309 B1 * 2/2004 James ............... H04L 25/14
                                                           341/50
2003/0081709 A1 * 5/2003 Ngo .................. H04L 7/00
                                                           375/362

(Continued)

FOREIGN PATENT DOCUMENTS

| TW | I363271 B | 5/2012 |
| TW | I419170 B | 12/2013 |
| TW | I426285 B | 2/2014 |

*Primary Examiner* — Douglas King
(74) *Attorney, Agent, or Firm* — CKC & Partners Co., LLC

(57) ABSTRACT

A semiconductor chip includes a physical layer and a processing circuit. The physical layer includes an input/output circuit, at least one sequence checking circuit and at least one signal transmission path, wherein the at least one sequence checking circuit is configured to generate at least one test result signal according to a clock signal transmitted through the input/output circuit and at least one test data signal transmitted through the at least one signal transmission path. The processing circuit is electrically coupled to the physical layer and is configured to determine an operation status of the at least one signal transmission path according to a voltage level of the at least one test result signal.

19 Claims, 14 Drawing Sheets

(51) Int. Cl.
*H03K 3/037* (2006.01)
*H03K 19/21* (2006.01)
*H10B 80/00* (2023.01)

(56) References Cited

U.S. PATENT DOCUMENTS

2010/0138729 A1 6/2010 Chen et al.
2011/0302471 A1 12/2011 Le-Gall
2018/0130780 A1* 5/2018 Gonzales ............ H01L 23/5386

* cited by examiner

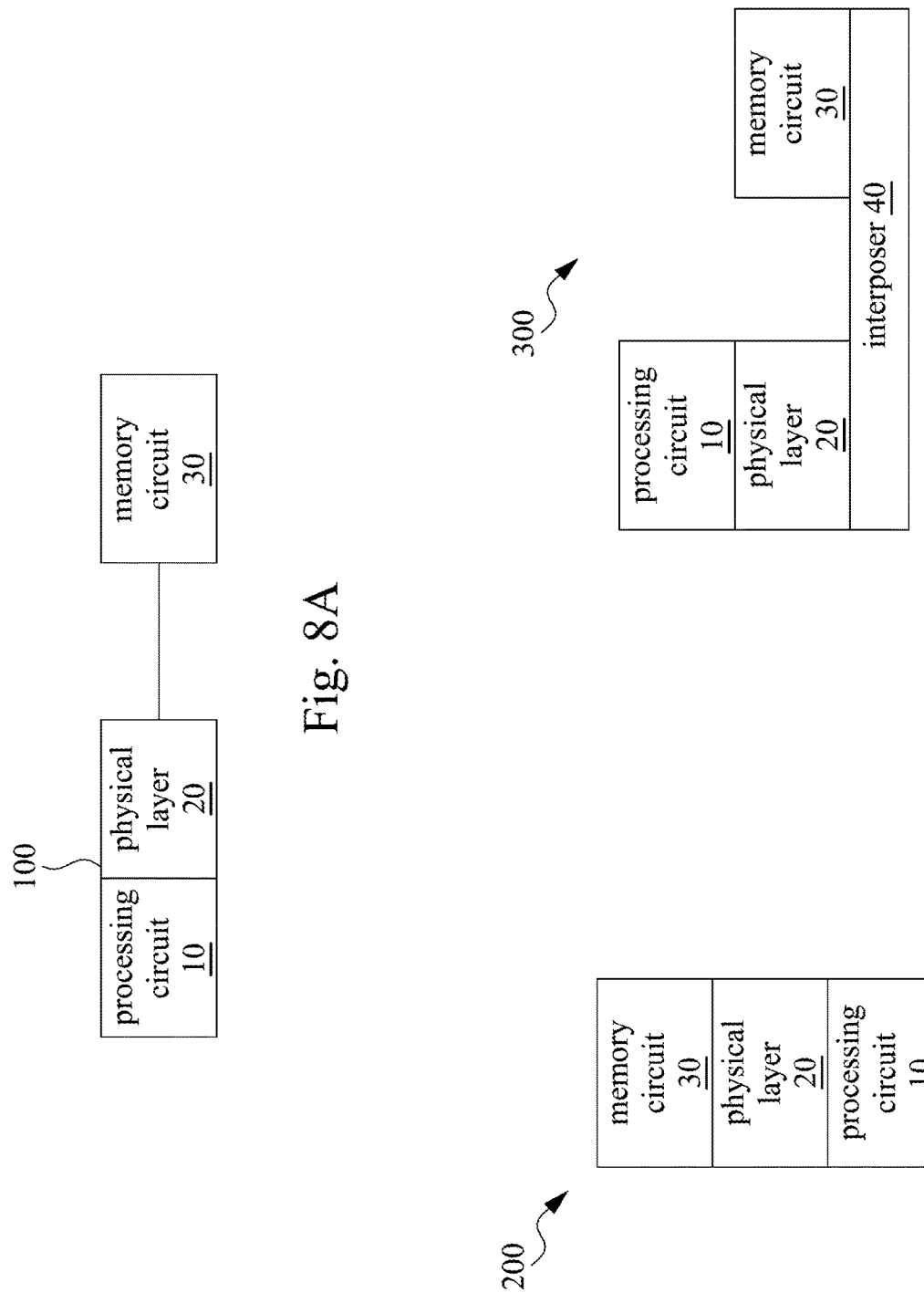

US 12,422,481 B2

SEMICONDUCTOR CHIP AND SEQUENCE CHECKING CIRCUIT

RELATED APPLICATIONS

This application claims priority to Taiwan Application Serial Number 111137371, filed on Sep. 30, 2022, which is herein incorporated by reference in its entirety.

BACKGROUND

Field of Invention

The disclosure is related to a semiconductor chip. More particularly, the disclosure is related to a semiconductor chip including a sequence checking circuit.

Description of Related Art

In the specification of high-bandwidth memory, the command/address physical layer (CAPHY) is designed to have only transmitter terminals without receiver terminals. Therefore, in design for testability (DFT), the command/address physical layer is not like the data quadword physical layer (DQPHY) which has a data loopback mechanism for testing. In view of this, it is necessary to improve the existing design to meet the requirements.

SUMMARY

A semiconductor chip is provided in the present disclosure. The semiconductor chip includes a physical layer and a processing circuit. The physical layer includes an input/output circuit, at least one sequence checking circuit and at least one signal transmission path, wherein the at least one sequence checking circuit is configured to generate at least one test result signal according to a clock signal transmitted through the input/output circuit and at least one test data signal transmitted through the at least one signal transmission path. The processing circuit is electrically coupled to the physical layer and is configured to determine an operation status of the at least one signal transmission path according to a voltage level of the at least one test result signal.

A sequence checking circuit is provided in the present disclosure. The sequence checking circuit is configured to check a test data signal transmitted through a signal transmission path of a physical layer, and includes a shift register circuit and an output terminal logic gate. The shift register circuit is configured to check each of a plurality of data values of the test data signal once according to a plurality of rising edges and a plurality of falling edges of a clock signal, so as to output a first checking result signal. The output terminal logic gate is configured to receive the first checking result signal to output a test result signal, wherein the test result signal is configured to indicate an operation status of the signal transmission path.

It should be understood that both the foregoing general description and the following detailed description are by examples, and are intended to provide further explanation of the disclosure as claimed.

BRIEF DESCRIPTION OF THE DRAWINGS

FIGS. 8A-8C are block diagrams of the semiconductor chip in accordance with some embodiments of the present disclosure.

DETAILED DESCRIPTION

Reference will now be made in detail to the present embodiments of the disclosure, examples of which are illustrated in the accompanying drawings. However, the specific embodiments described below are only used to explain the present disclosure, and are not used to limit the present disclosure. The description of the structure and operation is not used to limit the order of its execution. The structures reassembled from components, resulting in devices with equal efficacy, are all within the scope of the present disclosure.

The terms used throughout the present disclosure, unless otherwise specified, generally have the ordinary meaning of each term used in the field, in the content disclosed herein and in the specific content.

The term "coupled" or "connected" used throughout the present disclosure may refer to two or more elements physically or electrically contact with each other in direct, or physically or electrically contact with each other in indirect, or two or more elements interact or act on each other.

For the convenience of description, the lowercase English indexes 1-n in the component symbols used in the description and the drawings of the present disclosure are only for convenience to refer to individual elements, and are not used to limit the number of the foregoing elements to a specific number. In the description and drawings of the present disclosure, if a certain component symbol is used without specifying the index of the component symbol, it means that the component symbol refers to any unspecified component in the component group to which it belongs. For example, the object that the component symbol 11[1] refers to is the signal generating circuit 11[1], and the object that the component symbol 11 refers to is any unspecified signal generating circuit in the signal generating circuits 11[1]-11[n].

Figure 1:
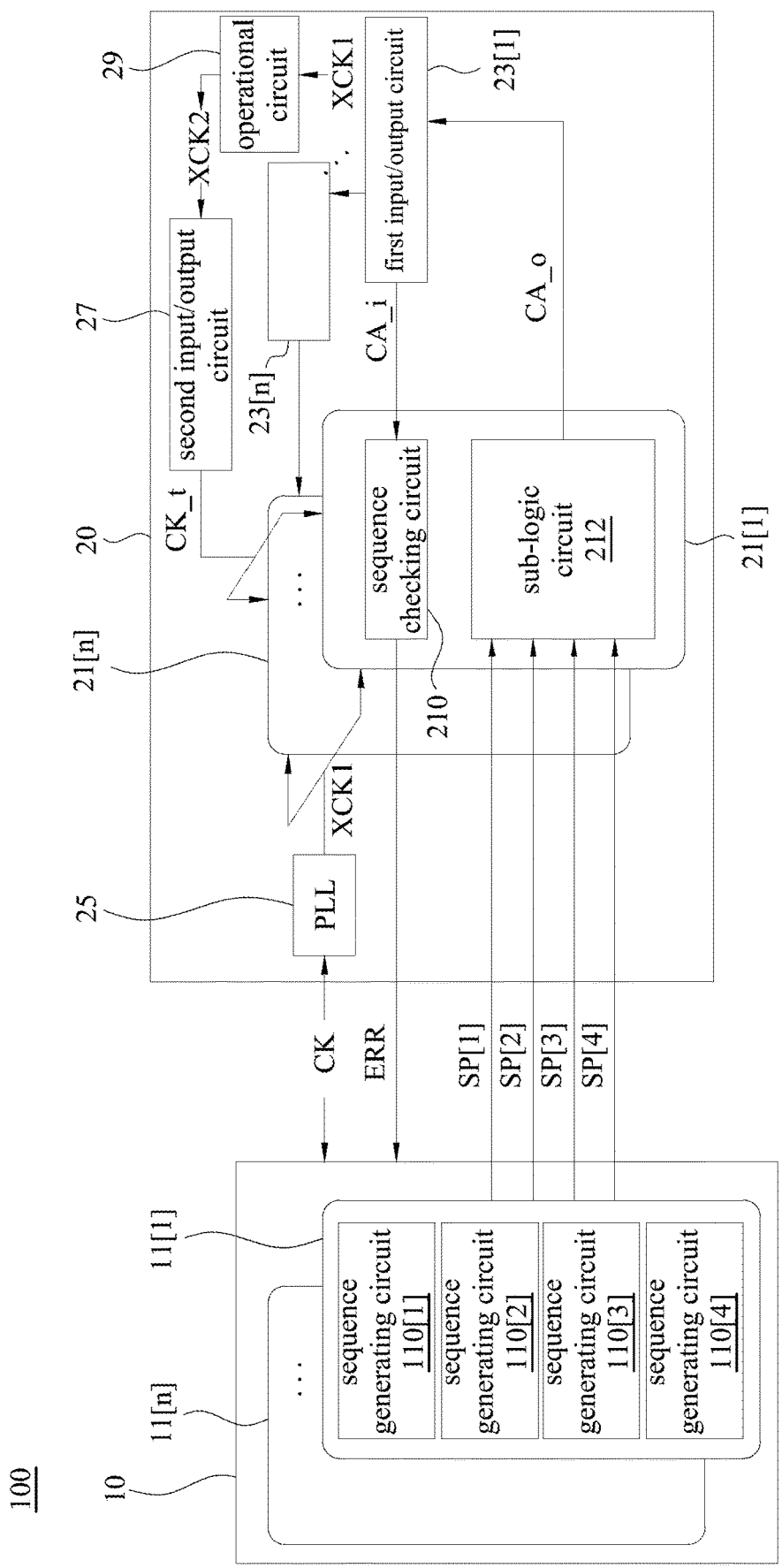
FIG. 1 is a block diagram of a semiconductor chip in accordance with some embodiments of the present disclosure.

Referring to FIG. 1. FIG. 1 is a block diagram of a semiconductor chip 100 in accordance with some embodiments of the present disclosure. In some embodiments, as shown in FIG. 1, the semiconductor chip 100 includes a processing circuit 10 and a physical layer (PHY) 20. Specifically, the processing circuit 10 may be implemented by a system-on-chip (SoC), and the physical layer 20 may be implemented by a command/address physical layer (CA-PHY).

First, the structures of the processing circuit 10 and the physical layer 20 will be described in detail. In some embodiments, the processing circuit 10 includes n of signal generating circuits 11[1]-11[n], where n is a positive integer greater than 1.

In some embodiments, n of the signal generating circuits 11[1]-11[n] have the same structure, but the present disclosure is not limited thereto. To simplify the description, the following description will be proceeded in detail below by taking the signal generating circuit 11[1] as an example. As shown in FIG. 1, the signal generating circuit 11[1] includes a plurality of sequence generating circuits 110[1]-110[4], but the number of the sequence generating circuits is not limited thereto. Specifically, the sequence generating circuits 110[1]-110[4] each is implemented by a pseudo-random binary sequence (PRBS) generator. The structure of the PRBS generator is well known to those skilled in the art to which the present disclosure belongs, so it will not be repeated here.

In some embodiments, the physical layer 20 is electrically coupled to the processing circuit 10 and includes logic circuits 21[1]-21[n], first input/output (I/O) circuits 23[1]-23[n], a phase-locked loop (PLL) circuit 25, a second I/O circuit 27 and an operational circuit 29. As above descriptions, n is the positive integer greater than 1. As shown in FIG. 1, the logic circuits 21[1]-21[n] are electrically coupled to the first I/O circuits 23[1]-23[n] respectively, and are electrically coupled to the signal generating circuits 11[1]-11[n] respectively. In addition, the PLL circuit 25 is coupled to the logic circuits 21[1]-21[n], the second I/O circuit 27 is also coupled to the logic circuits 21[1]-21[n], and the operational circuit 29 is coupled to the second I/O circuit 27.

In some embodiments, n of the logic circuits 21[1]-21[n] have the same structure, but the present disclosure is not limited thereto. To simplify the description, the following description will be proceeded in detail by taking the logic circuit 21[1] as an example. As shown in FIG. 1, the logic circuit 21[1] includes a sequence checking circuit 210 and a sub-logic circuit 212, and the sub-logic circuit 212 is coupled to the signal generating circuit 11[1]. Specifically, the sub-logic circuit 212 can be implemented by a parallel-to-serial conversion circuit. The structure of the parallel-to-serial conversion circuit is well known to those skilled in the art to which the present disclosure belongs, so it will not be repeated here. Corresponding to the sequence generating circuit 110 implemented by the PRBS generator, the sequence checking circuit 210 can be implemented by a PRBS checker. The structure of the sequence checking circuit 210 will be described in detail with reference to FIG. 2 in the following paragraphs.

In some embodiments, n of the first I/O circuits 23[1]-23[n] and the second I/O circuit 27 also have the same structure, but the present disclosure is not limited thereto. Specifically, the first I/O circuits 23[1]-23[n] each includes a transmission path (not shown) and a receiving path (not shown), and the second I/O circuit 27 also includes a transmission path (not shown) and a receiving path (not shown). The first I/O circuits 23[1]-23[n] and the second I/O circuit 27 can be implemented by the I/O circuit well known to those skilled in the art to which the present disclosure belongs, so it will not be repeated here.

Figure 2:
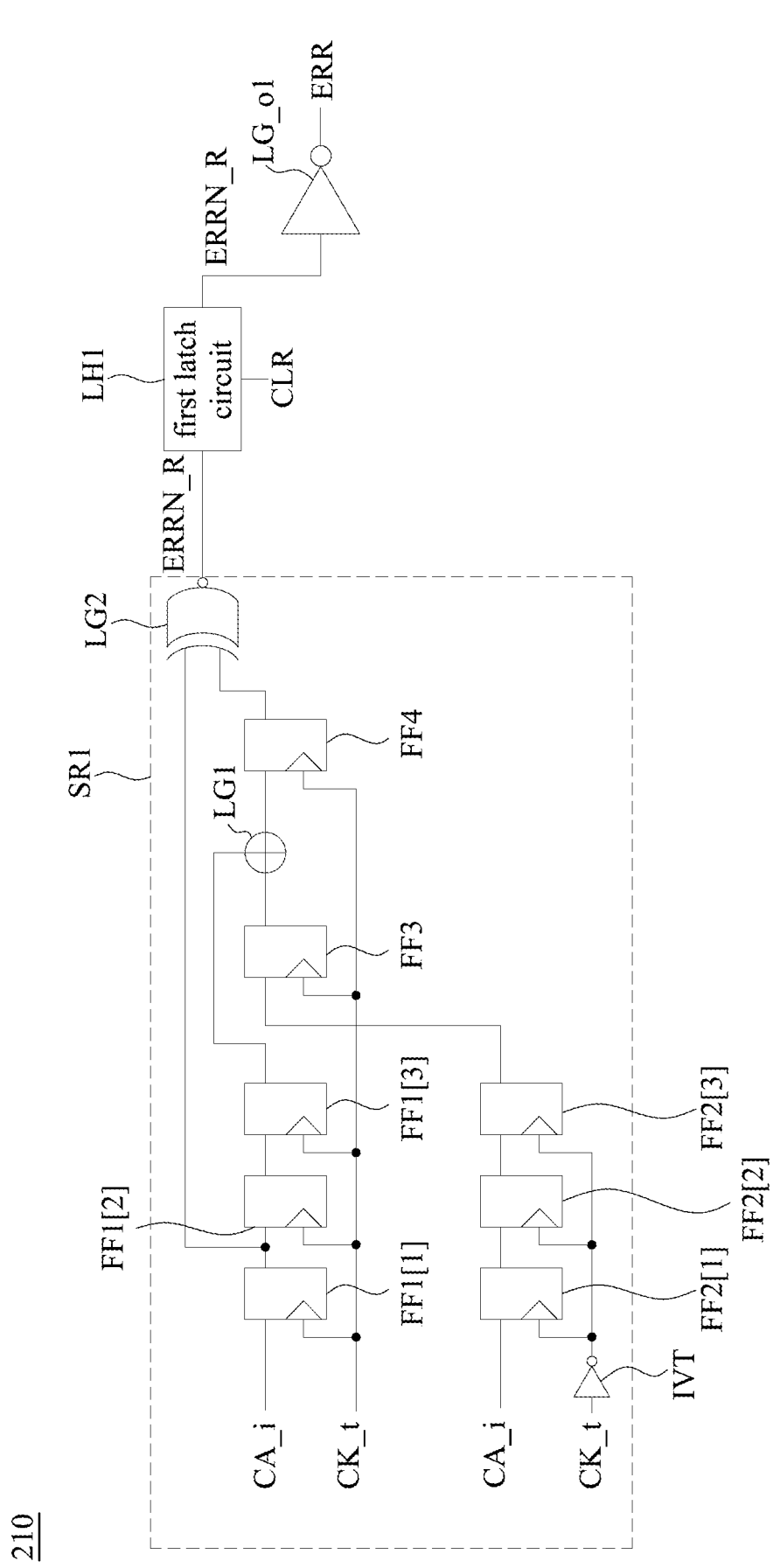
FIG. 2 is a circuit diagram of a sequence checking circuit in accordance with some embodiments of the present disclosure.

Referring to FIG. 2. FIG. 2 is a circuit diagram of the sequence checking circuit 210 in accordance with some embodiments of the present disclosure. In some embodiments, as shown in FIG. 2, the sequence checking circuit 210 includes a shift register circuit SR1, a first latch circuit LH1 and an output terminal logic gate LG_o1. Specifically, the first latch circuit LH1 is coupled between an output terminal of the shift register circuit SR1 and an input terminal of the output terminal logic gate LG_o1.

In addition, although not shown in FIG. 2, it should be understood that a data input terminal of the shift register circuit SR1 is coupled to the first I/O circuit 23[1] in FIG. 1, a clock input terminal of the shift register circuit SR1 is coupled to the second I/O circuit 27 in FIG. 1, and an output terminal of the output terminal logic gate LG_o1 is coupled to the processing circuit 10 in FIG. 1.

In some embodiments, as shown in FIG. 2, the shift register circuit SR1 includes a plurality of first flip-flops FF1[1]-FF1[3], a plurality of second flip-flops FF2[1]-FF2[3], a NOT gate IVT, a third flip-flop FF3, a first logic gate LG1, a fourth flip-flop FF4 and a second logic gate LG2. The first flip-flops FF1[1]-FF1[3] are connected in series, and the second flip-flops FF2[1]-FF2[3] are connected in series. The third flip-flop FF3 is coupled to a data output terminal of the second flip-flop FF2[3]. The first logic gate LG1 is coupled to a data output terminal of the first flip-flop FF1[3], a data output terminal of the third flip-flop FF3 and a data input terminal of the fourth flip-flop FF4. The second logic gate LG2 is coupled to a data output terminal of the first flip-flop FF1[1] and a data output terminal of the fourth flip-flop FF4.

In the embodiments of FIG. 2, the first logic gate LG1 is implemented by an exclusive-OR (XOR) gate, the second logic gate LG2 is implemented by an exclusive-NOR (XNOR) gate, and the output terminal logic gate LG_o1 can be implemented by a NOT gate. However, the present disclosure is not limited thereto.

In some embodiments, the semiconductor chip 100 is configured to be electrically coupled to a memory circuit (not shown in FIG. 1). In such way, the processing circuit 10 can send command signals and/or address signals to the memory circuit through the physical layer 20. In some embodiments, the user can utilize the processing circuit 10 to test the physical layer 20 before the semiconductor chip 100 is packaged, so as to prevent the memory circuit from receiving wrong signals due to abnormal operation of the physical layer 20. The testing operation of the processing circuit 10 on the physical layer 20 will be described in detail below.

Referring to FIG. 1 again, in some embodiments, the sequence generating circuits 110[1]-110[4] are configured to generate first data sequences SP[1]-SP[4] according to multiple preset seed values (or initial values) respectively. For example, the sequence generating circuit 110[1] generates the first data sequence SP[1] according to a first seed value, the sequence generating circuit 110[2] generates the first data sequence SP[2] according to a second seed value, the sequence generating circuit 110[3] generates the first data sequence SP[3] according to a third seed value, and the sequence generating circuit 110[4] generates the first data sequence SP[4] according to a fourth seed value. It should be understood that the first seed value, the second seed value, the third seed value and the fourth seed value may all be the same or all different, and may also be partially the same and partially different. Accordingly, the first data sequences SP[1]-SP[4] may all be the same or all different, or may be partially the same and partially different.

In some embodiments, the first data sequences SP[1]-SP[4] each includes a plurality of data values, and each data value may be a logic 1 or a logic 0. In other words, the first data sequences SP[1]-SP[4] each can be comprised of an arrangement of logic 1 and logic 0. Notably, by taking the sequence generating circuit 110[1] as an example, after the sequence generating circuit 110[1] outputs $2^M-1$ data values, next $2^M-1$ data values outputted by the sequence generating circuit 110[1] will have the same arrangement as the previously outputted $2^M-1$ data values, where M is the order of the PRBS generator (e.g., 4, 7, 15, 23, 31, etc.). The sequence generating circuits 110[2]-110[4] also have the similar operation, so it will not be repeated here. It should be understood that the data values of each of the first data sequences SP[1]-SP[4] are predictable in the condition that the seed values and the order of the PRBS generator are known.

Figure 3A:
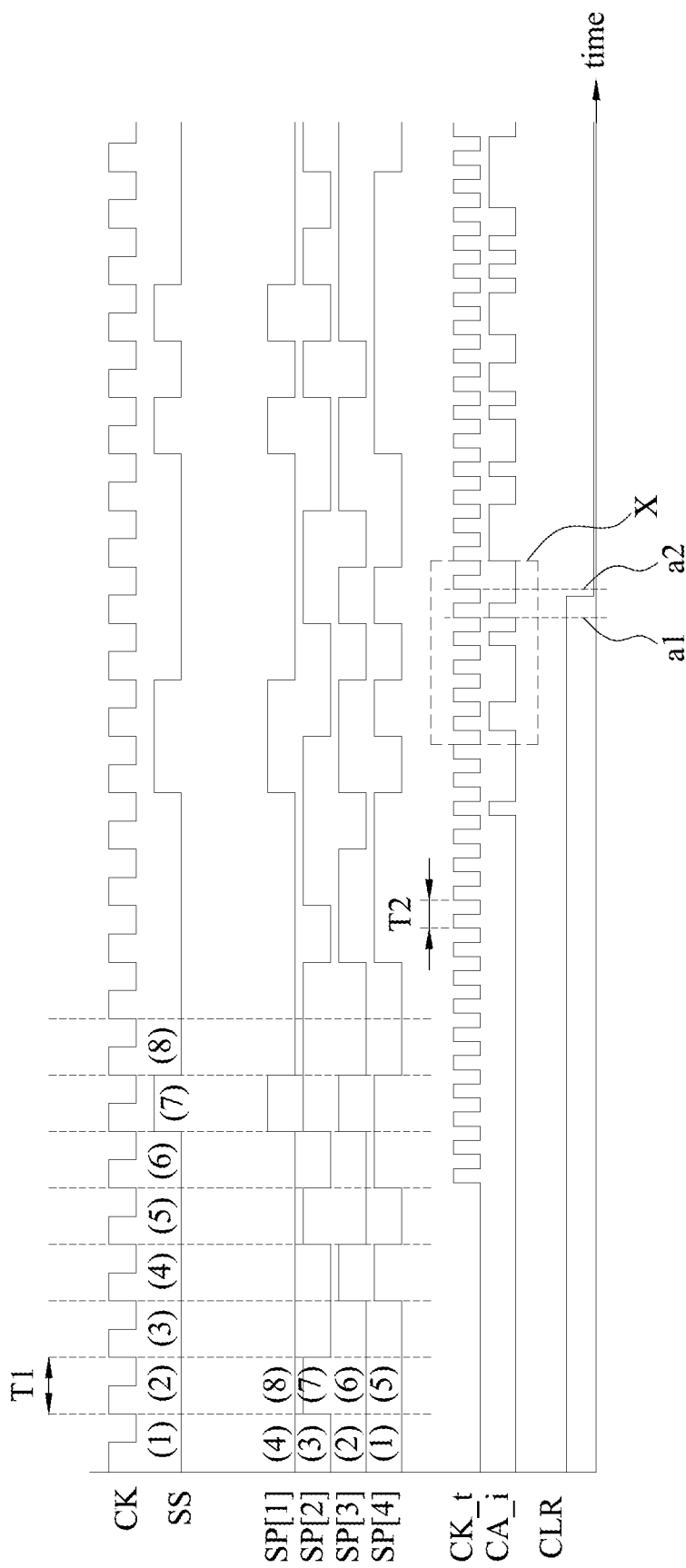
FIG. 3A is a timing diagram of multiple signals in the semiconductor chip in accordance with some embodiments of the present disclosure.

Referring to FIG. 3A. FIG. 3A is a timing diagram of multiple signals in the semiconductor chip 100 in accordance with some embodiments of the present disclosure. In some embodiments, by setting the first seed value, the second seed value, the third seed value and the fourth seed value, the signal generating circuit 11[1] may be regarded as outputting the data values of a reference data sequence SS in parallel through the sequence generating circuits 110[1]-110[4]. Taking first eight of the data values in the reference data sequence SS (represented by numbers (1)-(8) in FIG. 3A) as an example, with the triggering of a pulse in a clock signal CK, the data values numbered with (1)-(4) in the reference data sequence SS are outputted in parallel by the sequence generating circuits 110[1]-110[4]. Moreover, with the triggering of a next pulse in the clock signal CK, the data values numbered with (3)-(8) in the reference data sequence SS are outputted in parallel by the sequence generating circuits 110[1]-110[4].

In some embodiments, as shown in FIG. 1, the PLL circuit 25 is configured to generate another clock signal XCK1 to the logic circuits 21[1]-21[n] according to the clock signal CK. As shown in FIG. 3A, the clock signal CK has a period T1. In some embodiments, the frequency difference between the clock signal XCK1 and the clock signal CK corresponds to the number of the first data sequences SP[1]-SP[4]. For example, the number of the first data sequences SP[1]-SP[4] in FIG. 1 is four, therefore the frequency of the clock signal XCK1 is correspondingly four times the frequency of the clock signal CK, but the present disclosure is not limited thereto.

As shown in FIG. 1, the operational circuit 29 is configured to generate yet another clock signal XCK2 to the second I/O circuit 27 according to the clock signal XCK1. In some embodiments, the operational circuit 29 may be implemented by a dividing circuit, so that the frequency of the clock signal XCK2 is lower than the frequency of the clock signal XCK1. For example, the frequency of the clock signal XCK2 is 0.5 times the frequency of the clock signal XCK1. As can be seen from the above, the frequency of the clock signal XCK2 is two times the frequency of the clock signal CK.

In some embodiments, as shown in FIG. 1, the second I/O circuit 27 is configured to receive the clock signal XCK2 through the aforementioned transmission path, and is configured to transmit the clock signal XCK2 as yet another clock signal CK_t to the sequence checking circuit 210 through the aforementioned receiving path. That is to say, the second I/O circuit 27 is configured to output the clock signal CK_t according to the clock signal XCK2. The clock signal CK_t has a period T2. In some embodiments, as shown in FIG. 3A, period T2 is half the period T1. In other words, the frequency of the clock signal CK_t is two times the frequency of the clock signal CK, that is, the frequency of the clock signal CK_t is substantially the same as the frequency of the clock signal XCK2. However, the present disclosure is not limited thereto. For example, in other embodiments, the second I/O circuit 27 is configured to output the clock signal CK_t according to the clock signal CK or the clock signal XCK1. It is noting that the receiving path of the second I/O circuit 27 is usually disabled, and is only enabled during the testing of the physical layer 20.

In some embodiments, the sub-logic circuit 212 is configured to receive the first data sequences SP[1]-SP[4] to output a second data sequence CA_o. As shown in FIG. 1, the sub-logic circuit 212 is configured to receive the first data sequences SP[1]-SP[4] and convert the first data sequences SP[1]-SP[4] inputted in parallel into the second data sequence CA_o outputted in series according to the clock signal XCK1. In some embodiments, the ordering of the data values of the second data sequence CA_o is substantially the same as the ordering of the data values of the reference data sequence SS as shown in FIG. 3A. The second data sequence CA_o differs from the reference data sequence SS only in the output frequency of the data values. In addition, it should be understood that the number of the first data sequences SP[1]-SP[4] and the number of the sequence generating circuits 110[1]-110[4] can be changed according to requirements, and are not limited to four in FIG. 1 or FIG. 3A. For example, in some embodiments, the signal generating circuit 11 includes at least one sequence generating circuit and is configured to generate at least one first data sequence, and the sub-logic circuit 212 is configured to receive the at least one first data sequence.

In some embodiments, the first I/O circuit 23[1] is configured to receive the second data sequence CA_o through the aforementioned transmission path, and to transmit the second data sequence CA_o as a third data sequence CA_i to the sequence checking circuit 210 through the aforementioned receiving path.

It can be seen from the above that when the sub-logic circuit 212 and the first I/O circuit 23[1] are functioning properly, the ordering of the data values of the second data sequence CA_o and the ordering of the data values of the third data sequence CA_i will be substantially the same as the ordering of the data values of the reference data sequence SS. In addition, when at least one of the sub-logic circuit 212 and the first I/O circuit 23[1] is not functioning properly, the ordering of the data values of the third data sequence CA_i may be different from the ordering of the data values of the reference data sequence SS. The logic circuits 21[2]-21[n] and the first I/O circuits 23[2]-23[n] also have similar cooperative operation for circuit testing. For example, the first I/O circuit 23[2] is configured to convert the second data sequence CA_o from the sub-logic circuit 212 of the logic circuit 21[2] into the third data sequence CA_i and input the third data sequence CA_i to the sequence checking circuit 210 of the logic circuit 21[2]. It is noting that the receiving paths of the first I/O circuits 23[1]-23[n] are usually disabled, and are only enabled during the testing of the physical layer 20.

It is worth noting that, as shown in FIG. 1, the sequence checking circuit 210 of the present disclosure can check the third data sequence CA_i transmitted through the sub-logic circuit 212 and the first I/O circuit 23[1], so as to generate a test result signal ERR to the processing circuit 10. In this way, the processing circuit 10 can determine the operation status of each of the sub-logic circuit 212 and the first I/O circuits 23[1]-23[n] of the physical layer 20 according to the test result signal ERR.

Referring to FIG. 2 again, the shift register circuit SR1 of the sequence checking circuit 210 is configured to receive the third data sequence CA_i and the clock signal CK_t and is configured to check the third data sequence CA_i according to the clock signal CK_t, to output a first checking result signal ERRN_R. Specifically, as shown in FIG. 2, the first flip-flops FF1[1]-FF1[3], the third flip-flop FF3 and the fourth flip-flop FF4 in the shift register circuit SR1 all receive the clock signal CK_t directly, and the second flip-flops FF2[1]-FF2[3] in the shift register circuit SR1 all receive the clock signal CK_t through the NOT gate IVT. In other words, the second flip-flops FF2[1]-FF2[3] actually receive a clock signal (not shown) which has an opposite phase of the clock signal CK_t.

Figure 3B:
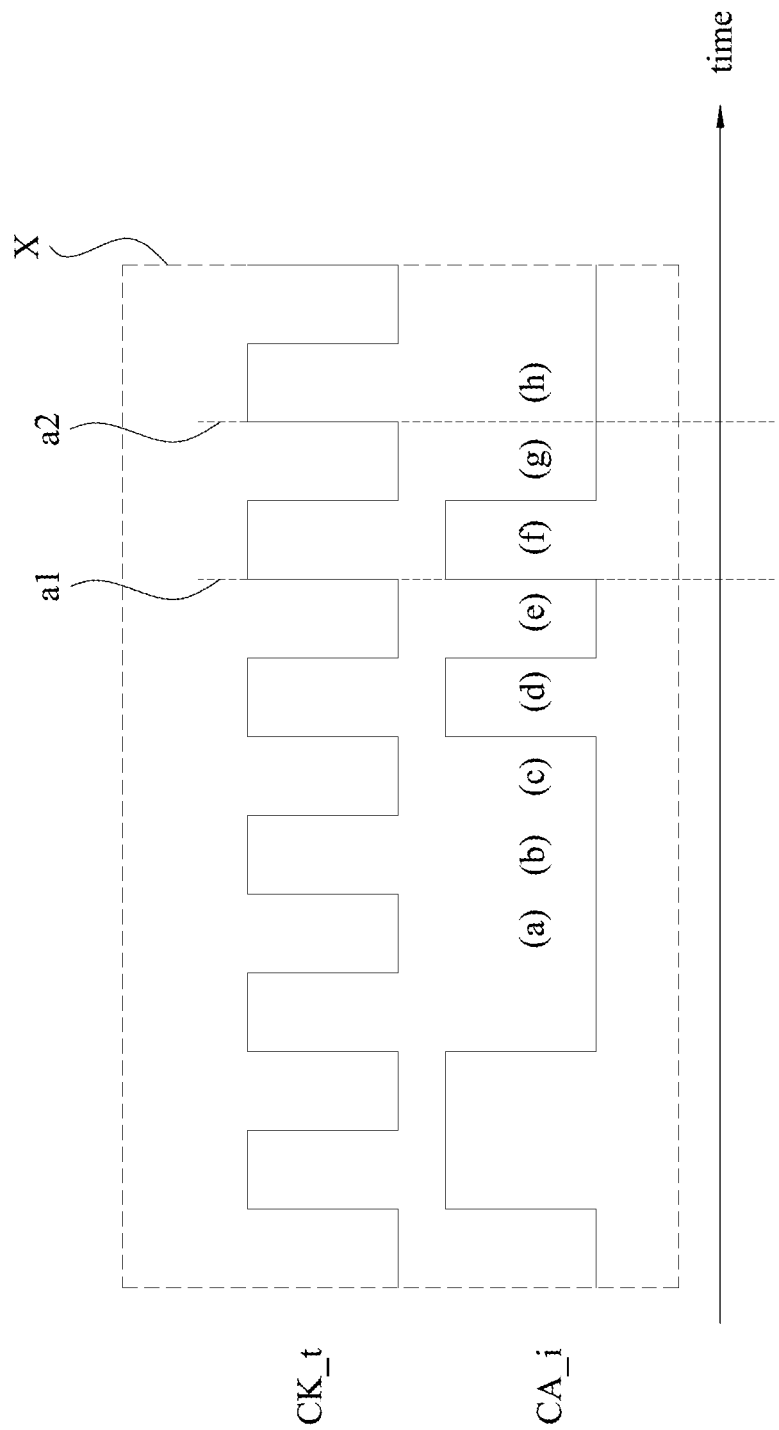
FIG. 3B is an enlarge diagram of a portion X in FIG. 3A.
Figure 4A:
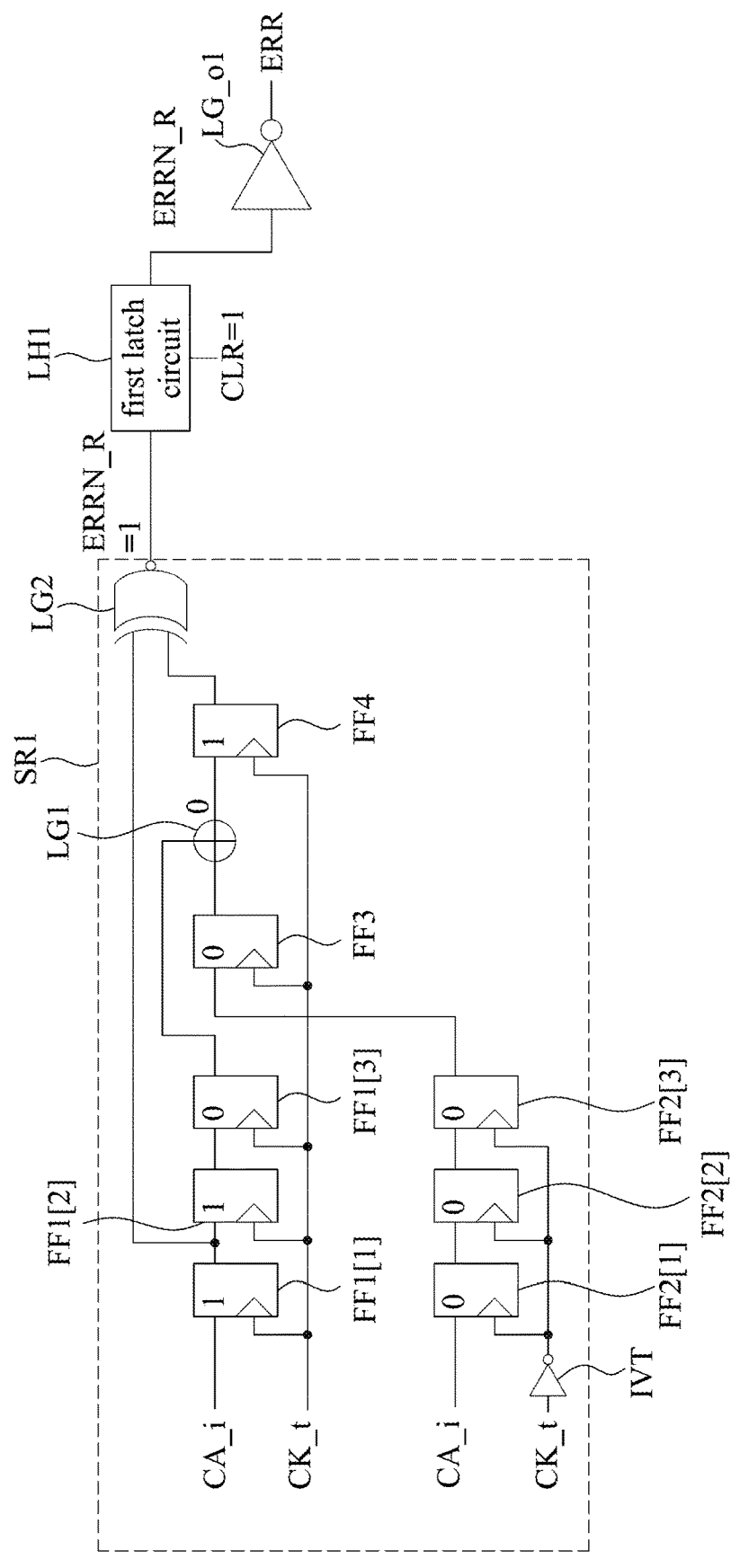
FIGS. 4A-4B are circuit diagrams of the sequence checking circuit at multiple times in accordance with some embodiments of the present disclosure.
Figure 4B:
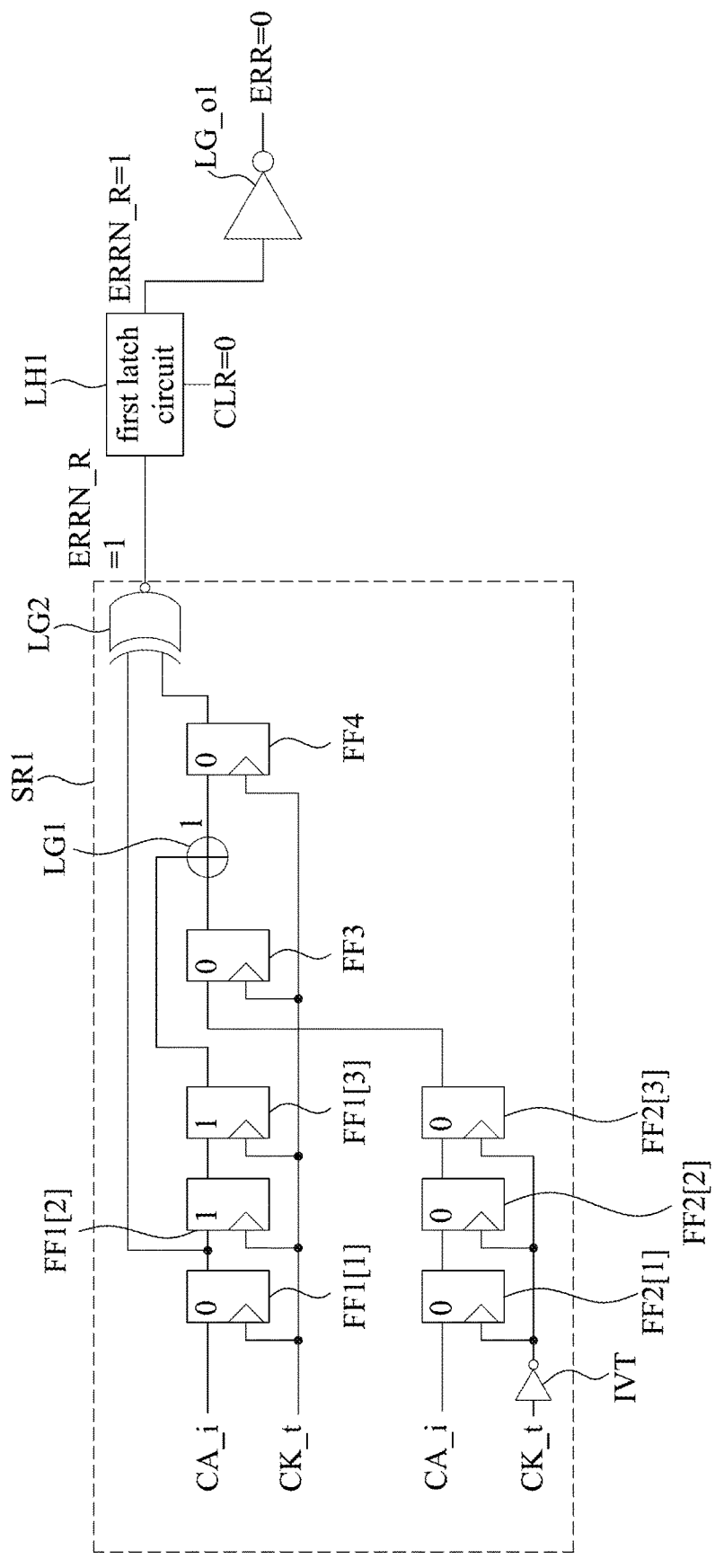

The operation of the shift register circuit SR1 would be described in detail below with reference to FIGS. 3B and 4A-4B. FIG. 3B is an enlarge diagram of a portion X in FIG. 3A, FIG. 4A is a circuit diagram of the sequence checking circuit 210 at a time a1 in accordance with some embodiments of the present disclosure and FIG. 4B is a circuit diagram of the sequence checking circuit 210 at a time a2 in accordance with some embodiments of the present disclosure.

In some embodiments, the first flip-flops FF1[1]-FF1[3] in the shift register circuit SR1 are configured to cache odd term of the data values of the third data sequence CA_i according to a plurality of rising edges of the clock signal CK_t, the second flip-flops FF2[1]-FF2[3] in the shift register circuit SR1 are configured to cache even term of the data values of the third data sequence CA_i according to a plurality of falling edges of the clock signal CK_t, and the third flip-flop FF3 in the shift register circuit SR1 is configured to cache the data value cached by the second flip-flop FF2[3] according to the rising edges of the clock signal CK_t.

With the triggering of multiple pulses in the clock signal CK_t, at the time a1, the first flip-flops FF1[1]-FF1 [3], the second flip-flops FF2[1]-FF2[3] and the third flip-flop FF3 each caches a corresponding one of the data values of the third data sequence CA_i. Taking the data values numbered with (a)-(h) in FIG. 3B as an example, as shown in FIG. 4A, at the time a1, the first flip-flop FF1[1] caches a logic 1 corresponding to the number (f), the first flip-flop FF1 [2] caches a logic 1 corresponding to the number (d), the first flip-flop FF1 [3] caches a logic 0 corresponding to the number (b), the second flip-flop FF2[1] caches a logic 0 corresponding to the number (e), the second flip-flop FF2[2] caches a logic 0 corresponding to the number (c), the second flip-flop FF2[3] caches a logic 0 corresponding to the number (a), and the third flip-flop FF3 caches a logic 0 cached by the second flip-flop FF2[3] (corresponding to the number (a) in FIG. 3B).

At the same time, as shown in FIG. 4A again, the first logic gate LG1 is configured to calculate a first calculation logic value (i.e., a logic 0) according to the data values cached by the first flip-flop FF1[3] and the third flip-flop FF3 at the time a1 (i.e., the logic 0 corresponding to the number (b) and the logic 0 corresponding to the number (a)).

In addition, the fourth flip-flop FF4 is configured to cache the first calculation logic value calculated by the first logic gate LG1 according to the rising edges of the clock signal CK_t. For example, at the time a1, the fourth flip-flop FF4 caches the logic 1 calculated by the first logic gate LG1 before the time a1 (this logic 1 is calculated according to two data values preceding the number (a) in FIG. 3B), and the logic 0 calculated by the first logic gate LG1 at the time a1 has not been cached by the fourth flip-flop FF4.

Referring to FIG. 3B again, at another time between the time a1 and the time a2 and corresponding to one of the falling edges of the clock signal, the first flip-flops FF1[1]-FF1[3], the third flip-flop FF3 and the fourth flip-flop FF4 would not be triggered, and the second flip-flops FF2[1]-FF2[3] each is triggered to cache the data value received by its data input terminal. For example, the second flip-flop FF2[1] caches a logic 0 corresponding to the number (g) in FIG. 3B, the second flip-flop FF2[2] caches the logic 0 cached by the second flip-flop FF2[1] at the time a1 (corresponding to the number (e) in FIG. 3B), and the second flip-flop FF2[3] caches the logic 0 cached by the second flip-flop FF2[2] at the time a1 (corresponding to the number (c) in FIG. 3B).

As shown in FIG. 3B, at the time a2, the first flip-flops FF1 [1]-FF1 [3], the third flip-flop FF3 and the fourth flip-flop FF4 each is triggered to cache the data value received by its data input terminal, and the second flip-flops FF2[1]-FF2[3] would not be triggered. For example, as shown in FIG. 4B, the first flip-flop FF1 [1] caches the data value of the third data sequence CA_i at the time a2 (i.e., a logic 0 corresponding to the number (h) in FIG. 3B), the first flip-flop FF1[2] caches the logic 1 cached by the first flip-flop FF1[1] at the time a1 (corresponding to the number (f) in FIG. 3B), the first flip-flop FF1 [3] caches the logic 1 cached by the first flip-flop FF1[2] at the time a1 (corresponding to the number (d) in FIG. 3B), the third flip-flop FF3 caches the logic 0 cached by the second flip-flop FF2[3] at said another time (corresponding to the number (c) in FIG. 3B), and the fourth flip-flop FF4 caches the logic 0 calculated by the first logic gate LG1 at the time a1.

In addition, at the time a2, the second logic gate LG2 is configured to calculate a first validation logic value (i.e., a logic 1) as the first checking result signal ERRN_R according to the first calculation logic value cached by the fourth flip-flop FF4 (i.e., the logic 0) and the data value cached by the first flip-flop FF1[1] (i.e., the logic 0).

In conclusion, the first logic gate LG1 calculates the first calculation logic value according to the data values cached by one of the first flip-flops FF1[1]-FF1[3] (e.g., the first flip-flop FF1[3]) and the third flip-flop FF3 at the time a1. Next, the second logic gate LG2 calculates the first validation logic value according to the first calculation logic value and the data value cached by another one of the first flip-flops FF1 [1]-FF1 [3] (e.g., the first flip-flop FF1[1]) at the time a2.

In the embodiments of FIG. 3A, both the reference data sequence SS and the third data sequence CA_i are 7-stage PRBS, but the present disclosure is not limited herein. As can be seen from the principle of generating 7-stage PRBS, the value obtained after first two of seven consecutive data values in PRBS calculated by XOR operation is equal to the eighth data value following the seven consecutive data values. According to this relationship, the shift register circuit SR1 compares whether the first calculation logic value calculated according to the two data values preceding the number (a) in FIG. 3B (i.e., the logic 1 and the logic 0) is equal to the data value numbered with (f) at the time a1, compares whether the first calculation logic value calculated according to the two data values numbered with (a) and (b) is equal to the data value numbered with (h) at the time a2, and compares the first calculation logic value calculated according to the two data values numbered with (c) and (d) at the rising edge of the clock signal CK_t. That is to say, the shift register circuit SR1 is configured to check the third data sequence CA_i according to the rising edges and the falling edges of the clock signal CK_t, to generate the first checking result signal ERRN_R.

As can be seen from the above, with the triggering of multiple pulses in the clock signal CK_t, the shift register circuit SR1 of FIG. 2 can perform the validation on two of the data values in the third data sequence CA_i without repetition, to check whether the third data sequence CA_i has the preset ordering. It should be understood that the validation of the first calculation logic value calculated according to the two data values numbered with (a) and (b) can be regarded as that the shift register circuit SR1 checks the data value numbered with (a) once, and can also be regarded as that the shift register circuit SR1 checks the data value numbered with (b) once. That is, the two data values numbered with (a) and (b) each is checked once. By analogy, each of the data values of the third data sequence CA_i would be checked at least once. As can be seen from that, by the shift register circuit SR1 of FIG. 2, the sequence checking circuit 210 is configured to check each of the data values of the third data sequence CA_i at least once according to the clock signal CK_t.

It is worth noting that, because the first checking result signal ERRN_R is logic 1 at the time a2, the at least one data value (i.e., the data value numbered with (a), the data value numbered with (b), or the data value numbered with (h)) of the third data sequence CA_i compared at the time a2 meets the expectation. It should be understood that if the first checking result signal ERRN_R is logic 0 at a certain time, the at least one data value of the third data sequence CA_i compared at said certain time fails to meet the expectation. Accordingly, the first checking result signal ERRN_R outputted by the shift register circuit SR1 can indicate whether the ordering of the third data sequence CA_i is normal.

In some embodiments, the first latch circuit LH1 is configured to selectively output the first checking result signal ERRN_R to the output terminal logic gate LG_o1 according to a control signal CLR. For example, as shown in FIG. 4B, the first latch circuit LH1 outputs the first checking result signal ERRN_R according to the control signal CLR with the first voltage level (e.g., logic 0).

As can be further seen from the above, the check on the third data sequence CA_i by the shift register circuit SR1 would be considered to be meaningful only after at least first seven data values of the third data sequence CA_i are inputted to the shift register circuit SR1. Therefore, the sequence checking circuit 210 sets a period of buffer time in which the first checking result signal ERRN_R is not outputted through the control signal CLR, to avoid from obtaining meaningless checking result. For example, in the embodiments of FIG. 4A, the second logic gate LG2 also calculates the first validation logic value (i.e., logic 1) as the first checking result signal ERRN_R according to the first calculation logic value calculated by the first logic gate LG1 before the time a1 (i.e., the logic 1 cached by the fourth flip-flop FF4) and the data value cached by the first flip-flop FF1[1] at the time a1 (i.e., logic 1). However, because the control signal CLR is set to have a second voltage level (i.e., logic 1) different from the first voltage level at this time, the first latch circuit LH1 will latch the first checking result signal ERRN_R. At this time, the first checking result signal ERRN_R at the output terminal of the first latch circuit LH1 and the test result signal ERR at the output terminal of the output terminal logic gate LG_o1 illustrated in FIG. 4A are meaningless.

In some embodiments, as shown in FIG. 4B, the output terminal logic gate LG_o1 is configured to output the test result signal ERR to the processing circuit 10 according to the voltage level of the first checking result signal ERRN_R.

In some embodiments, as shown in FIG. 4B, when the first checking result signal ERRN_R has the second voltage level (i.e., logic 1), the output terminal logic gate LG_o1 outputs the test result signal ERR with the first voltage level (i.e., logic 0). The processing circuit 10 determines that both the sub-logic circuit 212 and the first I/O circuit 23[1] are functioning properly according to the test result signal ERR having the first voltage level.

When the first checking result signal ERRN_R has the first voltage level (i.e., logic 0), the output terminal logic gate LG_o1 outputs the test result signal ERR with the second voltage level (i.e., logic 1). The processing circuit 10 determines that at least one of the sub-logic circuit 212 and the first I/O circuit 23[1] is not functioning properly according to the test result signal ERR having the second voltage level. It can be seen from this that the test result signal ERR can indicate the operation status of the sub-logic circuit 212 and a corresponding one of the first I/O circuits 23[1]-23[n] configured to transmit the third data sequence CA_i.

It can be seen from the above descriptions that the sequence checking circuit 210 of the present disclosure is configured to check the test data signal (i.e., the third data sequence CA_i) transmitted through the signal transmission path (i.e., the sub-logic circuit 212 and the first I/O circuit 23[1]) of the physical layer 20, but the present disclosure is not limited thereto. In other embodiments, the sequence checking circuit 210 may receive and check the second data sequence CA_o as the test data signal, so as to individually test the operation status of the sub-logic circuit 212 (i.e., the signal transmission path).

In the above embodiments, the sequence generating circuits 110[1]-110[4] each is implemented by a 7-stage PRBS generator, thus the sequence checking circuit 210 is also implemented by a 7-stage PRBS checker. For example, the total number of the first flip-flops FF1, the second flip-flops FF2 and the third flip-flop FF3 of the shift register circuit SR1 is seven. However, the present disclosure is not limited thereto. When the order of the PRBS generator is changed, the total number of the first flip-flops FF1, the second flip-flops FF2 and the third flip-flop FF3 is correspondingly changed, and the data values required for the calculation of the first logic gate LG1 may also be obtained from different flip-flops correspondingly. In addition, the buffer time may also be lengthened or shortened as the order of the PRBS generator changes.

In the above embodiments, as shown in FIG. 2, the sequence checking circuit 210 is configured to check each of the data values of the third data sequence CA_i at least once according to the clock signal CK_t, but the present disclosure is not limited thereto. For example, the present disclosure further provides a sequence checking circuit 310, and the sequence checking circuit 310 is configured to check each of the data values of the third data sequence CA_i at least twice according to the clock signal CK_t, which would be described in particular below.

Figure 5:
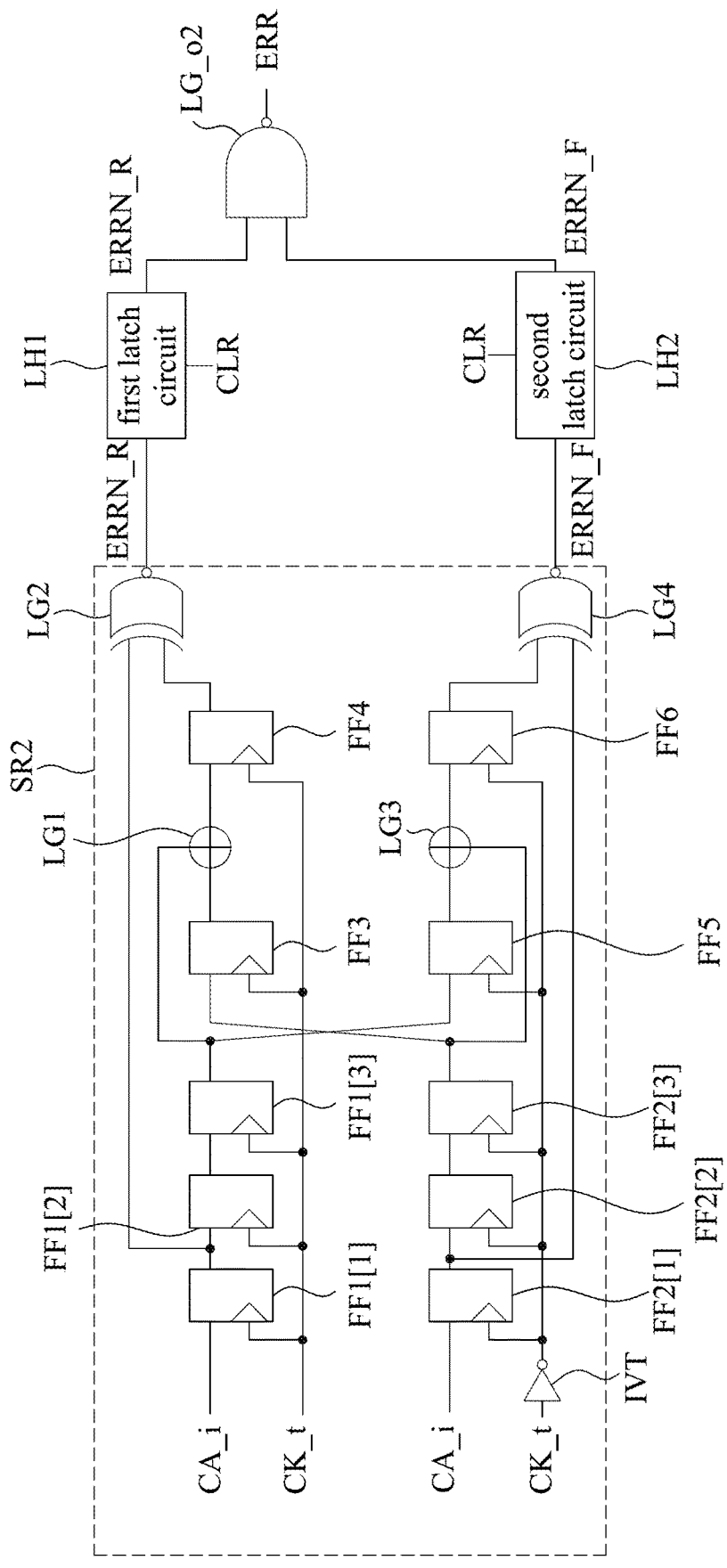
FIG. 5 is a circuit diagram of a sequence checking circuit in accordance with some embodiments of the present disclosure.

Referring to FIG. 5, FIG. 5 is a circuit diagram of the sequence checking circuit 310 in accordance with some embodiments of the present disclosure. In some embodiments, as shown in FIG. 5, the sequence checking circuit 310 includes a shift register circuit SR2, a first latch circuit LH1, a second latch circuit LH2 and an output terminal logic gate LG_o2. Specifically, the first latch circuit LH1 is coupled between the shift register circuit SR2 and a first input terminal of the output terminal logic gate LG_o2, and the second latch circuit LH2 is coupled between the shift register circuit SR2 and a second input terminal of the output terminal logic gate LG_o2.

It should be understood that the shift register circuit SR2 of FIG. 5 is different from the shift register circuit SR1 of FIG. 2. In addition to the first flip-flops FF1 [1]-FF1 [3], the second flip-flops FF2[1]-FF2[3], the NOT gate IVT, the third flip-flop FF3, the first logic gate LG1, the fourth flip-flop FF4 and the second logic gate LG2, the shift register circuit SR2 of FIG. 5 further includes a fifth flip-flop FF5, a third logic gate LG3, a sixth flip-flop FF6 and a fourth logic gate LG4. The connection of the first flip-flops FF1 [1]-FF1 [3], the second flip-flops FF2[1]-FF2[3], the NOT gate IVT, the third flip-flop FF3, the first logic gate LG1, the fourth flip-flop FF4 and the second logic gate LG2 is similar to those shown in FIG. 2, thus it is not repeated herein. As shown in FIG. 5, the fifth flip-flop FF5 is coupled to the data output terminal of the first flip-flop FF1[3]. The third logic gate LG3 is coupled to the data output terminal of the second flip-flop FF2[3], a data output terminal of the fifth flip-flop FF5 and a data input terminal of the sixth flip-flop FF6. The fourth logic gate LG4 is coupled to a data output terminal of the second flip-flop FF2[1] and a data output terminal of the sixth flip-flop FF6. In addition, the fifth flip-flop FF5 and the sixth flip-flop FF6 both receive the clock signal CK_t through the NOT gate IVT. In other words, the fifth flip-flop FF5 and the sixth flip-flop FF6 actually receive the clock signal which has an opposite phase of the clock signal CK_t.

In the embodiments of FIG. 5, the third logic gate LG3 is implemented by an exclusive-OR (XOR) gate, the fourth logic gate LG4 is implemented by an exclusive-NOR (XNOR) gate, and the output terminal logic gate LG_o2 can be implemented by a NAND gate. In addition, the implement of the first logic gate LG1 and the second logic gate LG2 is similar to those shown in FIG. 2, thus it is not repeated herein.

Figure 6A:
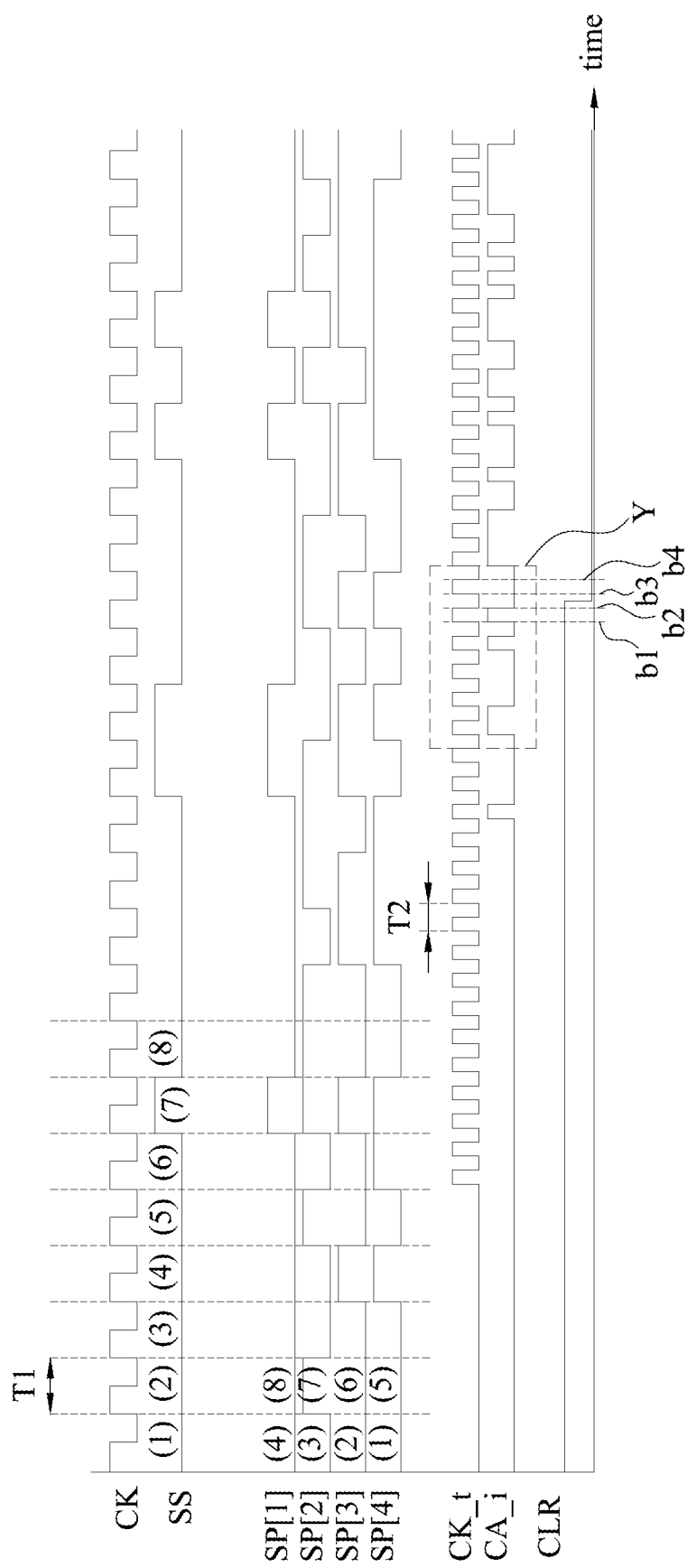
FIG. 6A is a timing diagram of multiple signals in the semiconductor chip in accordance with some embodiments of the present disclosure.
Figure 6B:
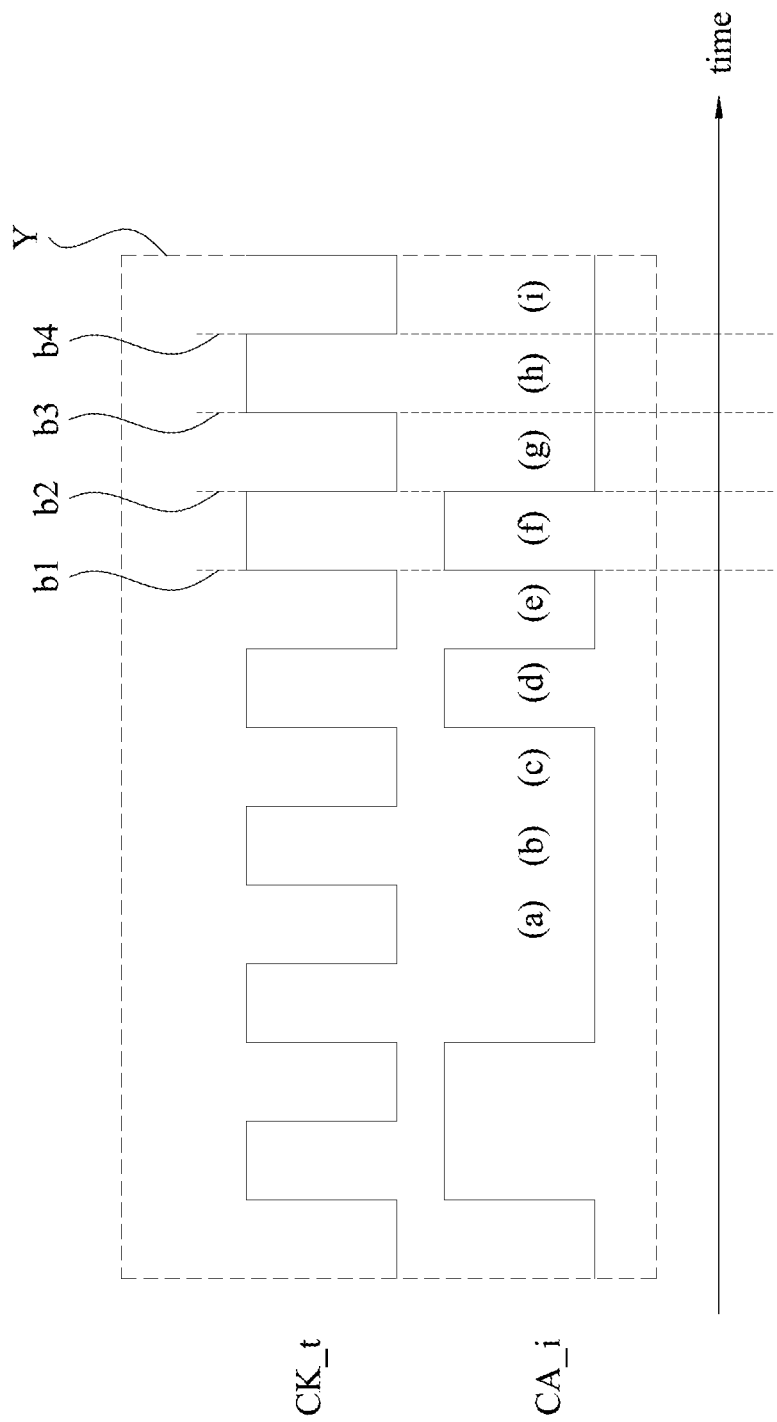
FIG. 6B is an enlarge diagram of a portion Y in FIG. 6A.

The operation of the shift register circuit SR2 of FIG. 5 would be described in detail below with reference to FIGS. 6A-6B and 7A-7D. FIG. 6A is a timing diagram of multiple signals in the semiconductor chip 100 in accordance with some embodiments of the present disclosure. FIG. 6B is an enlarge diagram of a portion Y in FIG. 6A. FIGS. 7A-7D are circuit diagrams of the sequence checking circuit 310 at multiple times b1-b4 in accordance with some embodiments of the present disclosure.

Figure 7A:
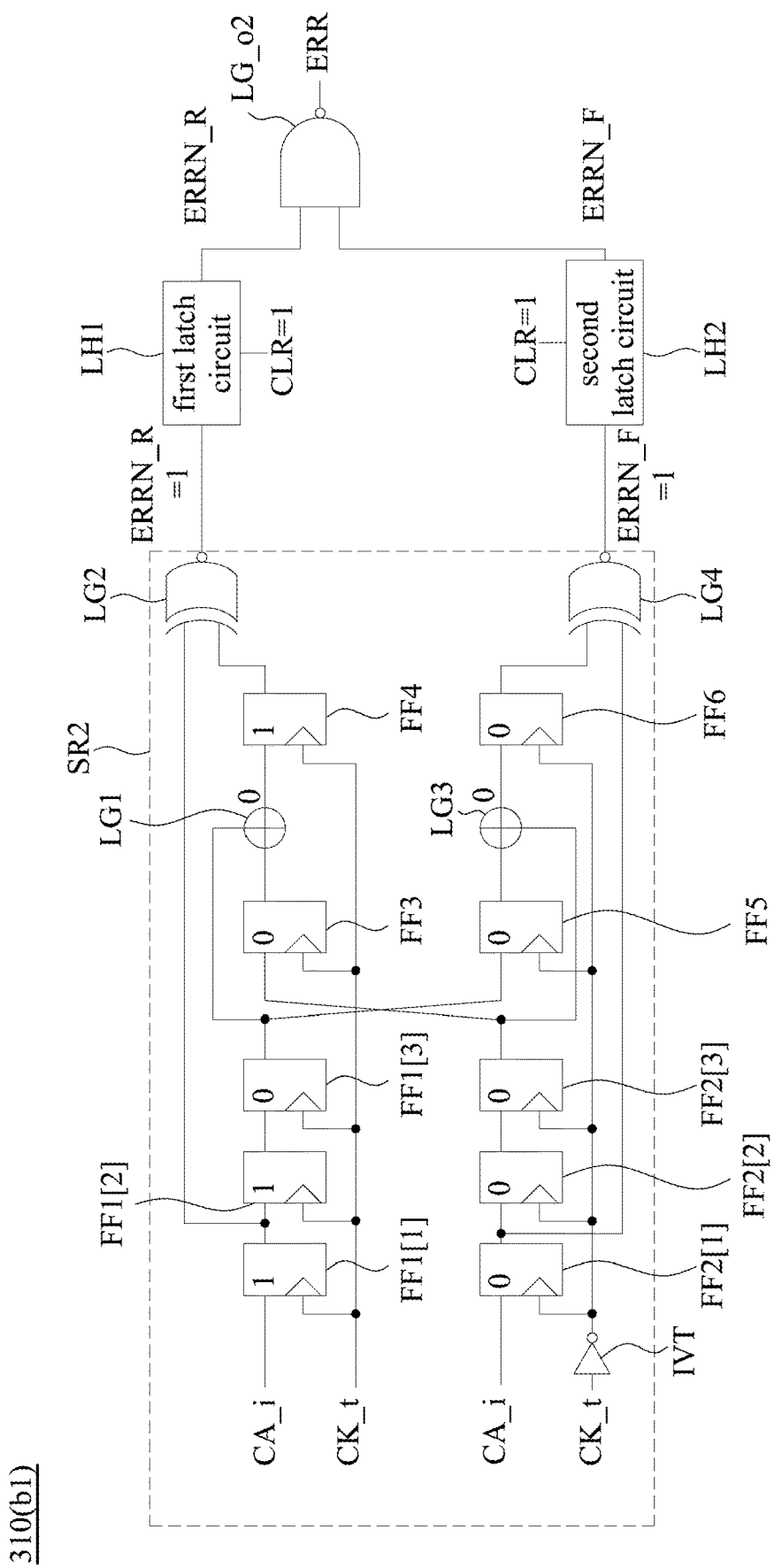
FIGS. 7A-7D are circuit diagrams of the sequence checking circuit at multiple times in accordance with some embodiments of the present disclosure.

With the triggering of multiple pulses in the clock signal CK_t, at the time b1 in FIG. 6B, the first flip-flops FF1 [1]-FF1 [3], the second flip-flops FF2[1]-FF2[3], the third flip-flop FF3 and the fifth flip-flop FF5 each caches a corresponding one of the data values of the third data sequence CA_i. Taking the data values numbered with (a)-(i) in FIG. 6B as an example, as shown in FIG. 7A, at the time b1, the first flip-flop FF1 [1] caches a logic 1 corresponding to the number (f), the first flip-flop FF1[2] caches a logic 1 corresponding to the number (d), the first flip-flop FF1[3] caches a logic 0 corresponding to the number (b), the second flip-flop FF2[1] caches a logic 0 corresponding to the number (e), the second flip-flop FF2[2] caches a logic 0 corresponding to the number (c), the second flip-flop FF2[3] caches a logic 0 corresponding to the number (a), the third flip-flop FF3 caches a logic 0 cached by the second flip-flop FF2[3] (corresponding to the number (a) in FIG. 6B), and the fifth flip-flop FF5 caches a logic 0 cached by the first flip-flop FF1[3] before the time b1 (i.e., a data value preceding the number (a) in FIG. 6B).

In addition, the fourth flip-flop FF4 caches the logic 1 calculated by the first logic gate LG1 before the time b1 according to the rising edges of the clock signal CK_t (this logic 1 is calculated according to two data values preceding the number (a) in FIG. 6B). The sixth flip-flop FF6 caches the logic 0 calculated by the third logic gate LG3 before the time b1 according to the falling edges of the clock signal CK_t (this logic 0 is calculated according to two logic 1 before the number (a) in FIG. 6B).

Figure 7B:
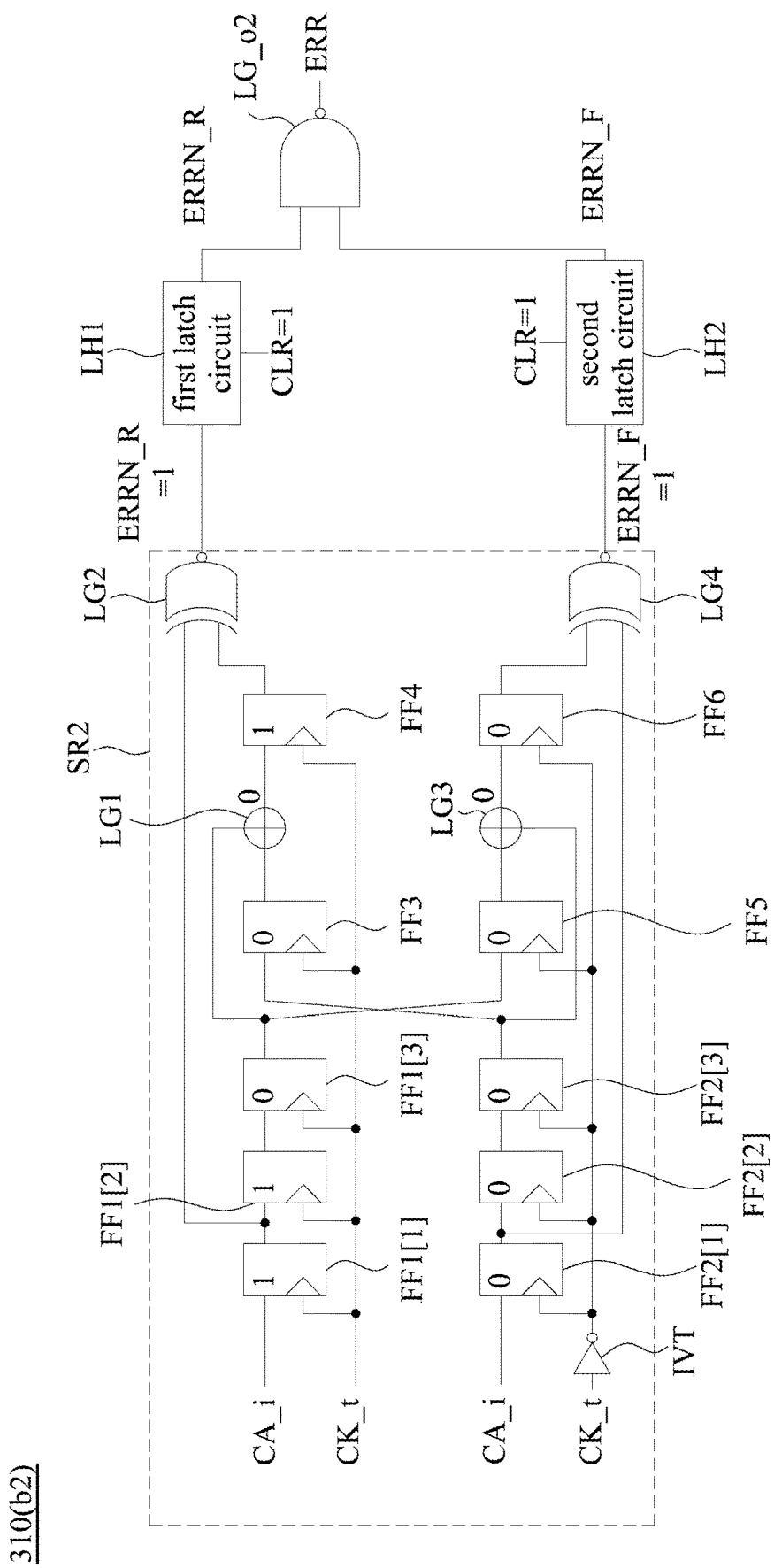

At the time b2 in FIG. 6B, the first flip-flops FF1 [1]-FF1 [3], the third flip-flop FF3 and the fourth flip-flop FF4 would not be triggered, and the second flip-flops FF2[1]-FF2[3], the fifth flip-flop FF5 and the sixth flip-flop FF6 each is triggered to cache the data value received by its data input terminal. For example, as shown in FIG. 7B, the second flip-flop FF2[1] caches a logic 0 corresponding to the number (g) in FIG. 6B, the second flip-flop FF2[2] caches the logic 0 cached by the second flip-flop FF2[1] at the time b1 (corresponding to the number (e) in FIG. 6B), the second flip-flop FF2[3] caches the logic 0 cached by the second flip-flop FF2[2] at the time b1 (corresponding to the number (c) in FIG. 6B), the fifth flip-flop FF5 caches the logic 0 cached by the first flip-flop FF1 [3] at the time b1 (corresponding to the number (b) in FIG. 6B), and the sixth flip-flop FF6 caches the logic 0 (i.e., second calculation logic value) calculated by the third logic gate LG3 before the time b2 (e.g., the time b1). It should be understood that because the first flip-flops FF1[1]-FF1[3], the third flip-flop FF3 and the fourth flip-flop FF4 are not triggered at this time, the data values cached by the first flip-flops FF1 [1]-FF1 [3], the third flip-flop FF3 and the fourth flip-flop FF4 at the time b2 are same as those shown in FIG. 7A.

Figure 7C:
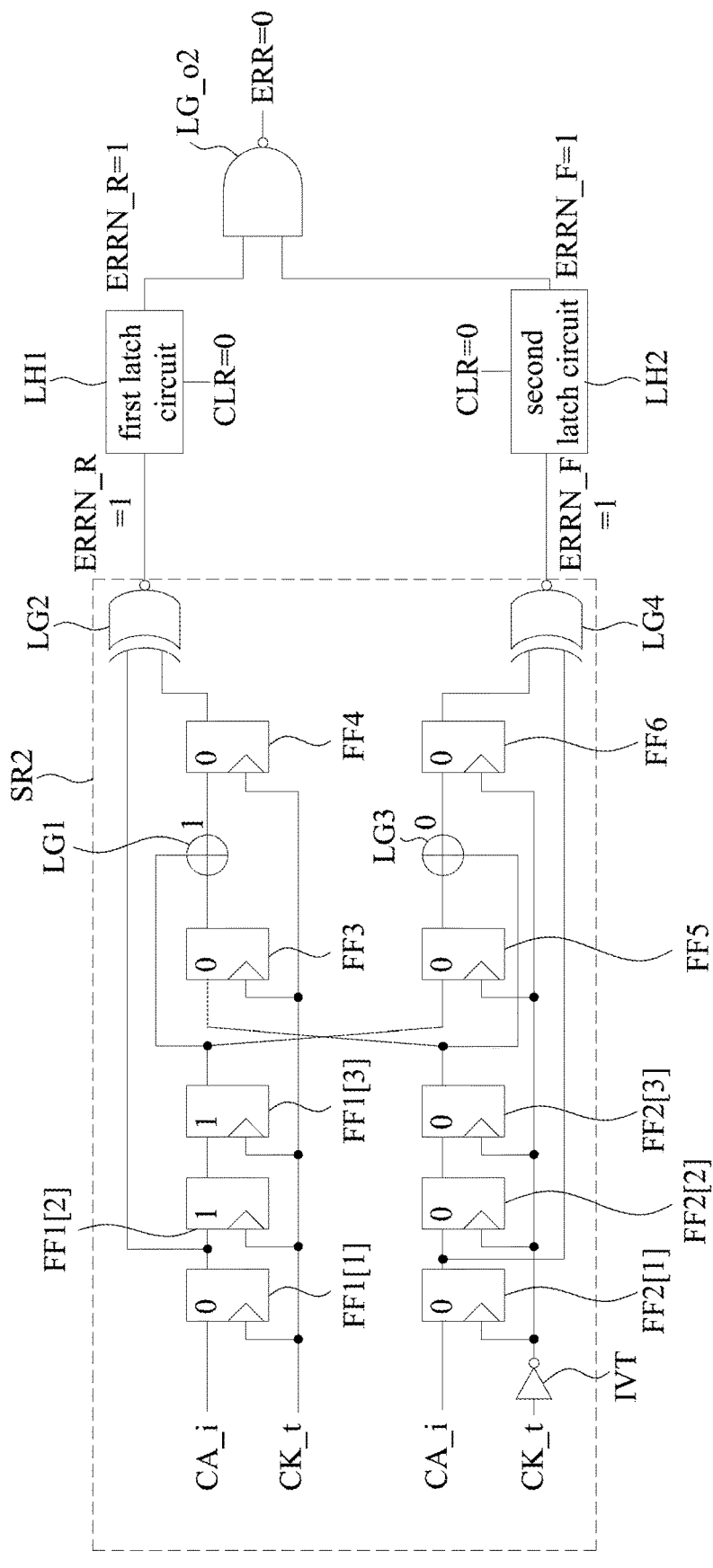

At the time b3 in FIG. 6B, the first flip-flops FF1 [1]-FF1 [3], the third flip-flop FF3 and the fourth flip-flop FF4 each is triggered to cache the data value received by its data input terminal, and the second flip-flops FF2[1]-FF2[3], the fifth flip-flop FF5 and the sixth flip-flop FF6 would not be triggered. For example, as shown in FIG. 7C, the first flip-flop FF1[1] caches a logic 0 corresponding to the number (h) in FIG. 6B, the first flip-flop FF1[2] caches the logic 1 cached by the first flip-flop FF1[1] at the time b2 (corresponding to the number (f) in FIG. 6B), the first flip-flop FF1 [3] caches the logic 1 cached by the first flip-flop FF1[2] at the time b2 (corresponding to the number (d) in FIG. 6B), the third flip-flop FF3 caches the logic 0 cached by the second flip-flop FF2[3] at the time b2 (corresponding to the number (c) in FIG. 6B), and the fourth flip-flop FF4 caches the logic 0 (i.e., first calculation logic value) calculated by the first logic gate LG1 before the time b3 (e.g., the time b2). It should be understood that because the second flip-flops FF2[1]-FF2[3], the fifth flip-flop FF5 and the sixth flip-flop FF6 are not triggered at this time, the data values cached by the second flip-flops FF2[1]-FF2[3], the fifth flip-flop FF5 and the sixth flip-flop FF6 at the time b3 are same as those shown in FIG. 7B.

Figure 7D:
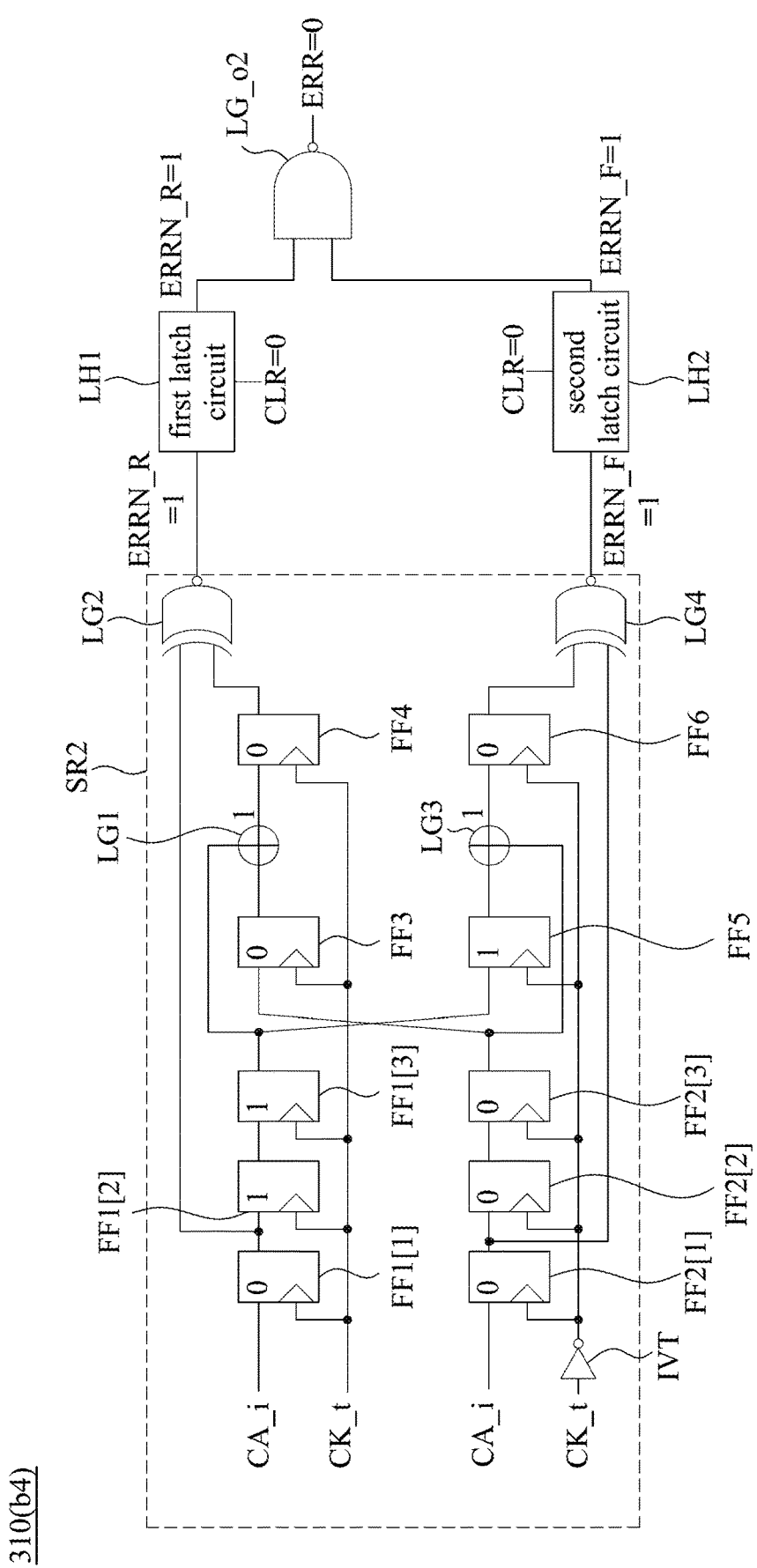

At the time b4 in FIG. 6B, the first flip-flops FF1 [1]-FF1 [3], the third flip-flop FF3 and the fourth flip-flop FF4 would not be triggered, and the second flip-flops FF2[1]-FF2[3], the fifth flip-flop FF5 and the sixth flip-flop FF6 each is triggered to cache the data value received by its data input terminal. For example, as shown in FIG. 7D, the second flip-flop FF2[1] caches a logic 0 corresponding to the number (i) in FIG. 6B, the second flip-flop FF2[2] caches the logic 0 cached by the second flip-flop FF2[1] at the time b3 (corresponding to the number (g) in FIG. 6B), the second flip-flop FF2[3] caches the logic 0 cached by the second flip-flop FF2[2] at the time b3 (corresponding to the number (e) in FIG. 6B), the fifth flip-flop FF5 caches the logic 0 cached by the first flip-flop FF1 [3] at the time b3 (corresponding to the number (d) in FIG. 6B), and the sixth flip-flop FF6 caches the logic 0 (i.e., second calculation logic value) calculated by the third logic gate LG3 before the time b4 (e.g., the time b3). It should be understood that because the first flip-flops FF1[1]-FF1[3], the third flip-flop FF3 and the fourth flip-flop FF4 are not triggered at this time, the data values cached by the first flip-flops FF1 [1]-FF1 [3], the third flip-flop FF3 and the fourth flip-flop FF4 at the time b4 are same as those shown in FIG. 7C.

In the embodiments of FIGS. 7A-7D, the first logic gate LG1 calculates the first calculation logic value (i.e., a logic 0) according to the data values cached by the first flip-flop FF1 [3] and the third flip-flop FF3 at the times b1 and b2 (i.e., the logic 0 corresponding to the number (b) and the logic 0 corresponding to the number (a)), and calculates the first calculation logic value (i.e., a logic 1) according to the data values cached by the first flip-flop FF1[3] and the third flip-flop FF3 at the times b3 and b4 (i.e., the logic 1 corresponding to the number (d) and the logic 0 corresponding to the number (c)).

In the embodiments of FIGS. 7A-7D, the second logic gate LG2 compares the first calculation logic value calculated according to the two data values preceding the number (a) in FIG. 6B with the data value corresponding to the number (f) at the times b1 and b2, and compares the first calculation logic value calculated according to the two data values numbered with (a) and (b) with the data value corresponding to the number (h) at the times b3 and b4.

In the embodiments of FIGS. 7A-7D, the third logic gate LG3 calculates the second calculation logic value (i.e., a logic 0) according to the data values cached by the second flip-flop FF2[3] and the fifth flip-flop FF5 at the time b1 (i.e., the logic 0 corresponding to the number (a) and the logic 0 preceding the number (a) in FIG. 6B), calculates the second calculation logic value (i.e., a logic 0) according to the data values cached by the second flip-flop FF2[3] and the fifth flip-flop FF5 at the times b2 and b3 (i.e., the logic 0 corresponding to the number (c) and the logic 0 corresponding to the number (b)), and calculates the second calculation logic value (i.e., a logic 1) according to the data values cached by the second flip-flop FF2[3] and the fifth flip-flop FF5 at the time b4 (i.e., the logic 0 corresponding to the number (e) and the logic 1 corresponding to the number (d)).

In the embodiments of FIGS. 7A-7D, the fourth logic gate LG4 compares the second calculation logic value calculated according to the two logic 1 before the number (a) in FIG. 6B with the data value corresponding to the number (e) at the time b1, compares the second calculation logic value calculated according to the data value numbered with (a) and the data value preceding the number (a) in FIG. 6B with the data value corresponding to the number (g) at the times b2 and b3, and compares the second calculation logic value calculated according to the two data values numbered with (b) and (c) with the data value corresponding to the number (i) at the time b4.

In conclusion, the third logic gate LG3 calculates the second calculation logic value according to the data values cached by one of the second flip-flops FF2[1]-FF2[3] (e.g., the second flip-flop FF2[3]) and the fifth flip-flop FF5 at a certain time (e.g., the time b2, the time b3). Next, the fourth logic gate LG4 calculates the second validation logic value as a second checking result signal ERRN_F according to the second calculation logic value and the data value cached by another one of the second flip-flops FF2[1]-FF2[3](e.g., the second flip-flop FF2[1]) at another time (e.g., the time b4) after said certain time. It should be understood that the operations of the first logic gate LG1 and the second logic gate LG2 in FIGS. 5 and 7A-7D are same or similar to those of the first logic gate LG1 and the second logic gate LG2 in FIGS. 2 and 4A-4B, thus it is not repeated herein.

As can be seen from the above descriptions, the shift register circuit SR2 compares whether the first calculation logic value calculated according to the two data values preceding the number (a) in FIG. 6B (i.e., the logic 1 and the logic 0) is equal to the data value numbered with (f) at the time b1, compares whether the second calculation logic value calculated according to the data value preceding the number (a) in FIG. 6B (i.e., the logic 0) and the data value numbered with (a) is equal to the data value numbered with (g) at the time b2, compares whether the first calculation logic value calculated according to the two data values numbered with (a) and (b) is equal to the data value numbered with (h) at the time b3, and compares the second calculation logic value calculated according to the two data values numbered with (b) and (c) is equal to the data value numbered with (i) at the time b4. That is to say, the shift register circuit SR2 is configured to check the third data sequence CA_i according to the rising edges and the falling edges of the clock signal CK_t, to generate the first checking result signal ERRN_R and the second checking result signal ERRN_F.

Taking the data value numbered with (b) as an example, the shift register circuit SR2 of FIG. 5 checks the data value numbered with (b) once at the time b3 to generate the first checking result signal ERRN_R, and checks the data value numbered with (b) once again at the time b4 to generate the second checking result signal ERRN_F. By analogy, each of the data values of the third data sequence CA_i would be checked at least twice. As can be seen from that, by the shift register circuit SR2 of FIG. 5, the sequence checking circuit 310 is configured to check each of the data values of the third data sequence CA_i at least twice according to the clock signal CK_t.

In the embodiments of FIG. 5, the operation of the first latch circuit LH1 is same or similar to those of the first latch circuit LH1 of FIG. 2, thus it is not repeated herein.

In some embodiments, the second latch circuit LH2 is configured to selectively output the second checking result signal ERRN_F to the output terminal logic gate LG_o2 according to the control signal CLR. For example, as shown in FIGS. 7A-7B, the second latch circuit LH2 latches the second checking result signal ERRN_F according to the control signal CLR with the second voltage level (i.e., logic 1). As shown in FIGS. 7C-7D, the second latch circuit LH2 outputs the second checking result signal ERRN_F according to the control signal CLR with the first voltage level (i.e., logic 0).

In some embodiments, as shown in FIGS. 7C-7D, the output terminal logic gate LG_o2 is configured to output the test result signal ERR to the processing circuit 10 according to the voltage level of the first checking result signal ERRN_R and the voltage level of the second checking result signal ERRN_F.

When both the first checking result signal ERRN_R and the second checking result signal ERRN_F have the second voltage level (i.e., logic 1), the output terminal logic gate LG_o2 outputs the test result signal ERR with the first voltage level (i.e., logic 0). The processing circuit 10 determines that the sub-logic circuit 212 and the first I/O circuit 23[1] are functioning properly according to the test result signal ERR having the first voltage level.

When at least one of the first checking result signal ERRN_R and the second checking result signal ERRN_F has the first voltage level (i.e., logic 0), the output terminal logic gate LG_o2 outputs the test result signal ERR with the second voltage level (i.e., logic 1). The processing circuit 10 determines that at least one of the sub-logic circuit 212 and the first I/O circuit 23[1] is not functioning properly according to the test result signal ERR having the second voltage level. It can be seen from this that the test result signal ERR can indicate the operation status of the sub-logic circuit 212 and a corresponding one of the first I/O circuits 23[1]-23[n] configured to transmit the third data sequence CA_i.

In the embodiments of FIG. 1, when the physical layer 20 is coupled to the memory circuit, the first I/O circuits 23[1]-23[n] can be configured to transmit command signals and/or address signals to the memory circuit, and the second I/O circuit 27 can be configured to transmit the clock signal to the memory circuit.

In the above embodiments, referring to FIGS. 1 and 8A together, the semiconductor chip 100 is electrically coupled to the packaged memory circuit 30 after being packaged, but the present disclosure is not limited thereto. For example, referring to FIG. 8B, FIG. 8B is a block diagram of a semiconductor chip 200 in accordance with some embodiments of the present disclosure. In some embodiments, as shown in FIG. 8B, the processing circuit 10 and the physical layer 20 of the semiconductor chip 200 may be packaged together with the memory circuit 30. In other words, the semiconductor chip 200 may include the processing circuit 10, the physical layer 20 and the memory circuit 30, in which the circuit structures and operations of the processing circuit 10 and the physical layer 20 of the semiconductor chip 200 are similar to those of the processing circuit 10 and the physical layer 20 of the semiconductor chip 100. In some embodiments, as shown in FIG. 8B, the physical layer 20 may be directly coupled to the memory circuit 30, but the present disclosure is not limited thereto. For example, referring to FIG. 8C, FIG. 8C is a block diagram of a semiconductor chip 300 in accordance with some embodiments of the present disclosure. In some embodiments, the semiconductor chip 300 may further include an interposer 40 in addition to the processing circuit 10, the physical layer 20 and the memory circuit 30, and the physical layer 20 and the memory circuit 30 are indirectly coupled to each other through the interposer 40. The circuit structures and operations of the processing circuit 10 and the physical layer 20 of the semiconductor chip 300 are similar to those of the processing circuit 10 and the physical layer 20 of the semiconductor chip 100. Specifically, the memory circuit 30 can be implemented by a high bandwidth memory.

It can be seen from the above-mentioned embodiments that, with the sequence checking circuit, the semiconductor chip of the present disclosure can create a data loopback mechanism suitable for the command/address physical layer, so as to expand the coverage of the design for testability. In addition, by checking each of the data values of the test data signal at least once, the sequence checking circuit of the present disclosure can dramatically reduce the usage quantity of the flip-flops, to decrease the circuit area.

The above are preferred embodiments of the present disclosure, and various modifications and equivalent changes may be made to the structure of the present disclosure without departing from the scope or spirit of the present disclosure. In view of the foregoing, it is intended that the present disclosure cover modifications and variations of this invention provided they fall within the scope of the following claims.

What is claimed is:

1. A semiconductor chip, comprising:
   a physical layer, comprising an input/output circuit, at least one sequence checking circuit and at least one signal transmission path, wherein the at least one sequence checking circuit is configured to generate at least one test result signal according to a clock signal transmitted through the input/output circuit and at least one test data signal transmitted through the at least one signal transmission path; and
   a processing circuit, electrically coupled to the physical layer and configured to determine an operation status of the at least one signal transmission path according to a voltage level of the at least one test result signal,
   wherein the at least one sequence checking circuit comprises:
      a shift register circuit, configured to check a plurality of data values of at least one test data signal according to a plurality of rising edges and a plurality of falling edges of the clock signal, so as to output a first checking result signal; and
      an output terminal logic gate, configured to output the at least one test result signal according to a voltage level of the first checking result signal.

2. The semiconductor chip of claim 1, wherein the at least one test data signal comprises the plurality of data values, and the at least one sequence checking circuit is configured to check each of the plurality of data values at least once according to the clock signal.

3. The semiconductor chip of claim 2, wherein the shift register circuit comprises:
   a plurality of first flip-flops, connected in series and configured to sequentially cache odd term of the plurality of data values according to the plurality of rising edges of the clock signal;
   a plurality of second flip-flops, connected in series and configured to sequentially cache even term of the plurality of data values according to the plurality of falling edges of the clock signal;
   a third flip-flop, configured to cache the data value cached by one of the plurality of second flip-flops according to the plurality of rising edges of the clock signal;
   a first logic gate, configured to calculate a first calculation logic value according to the data value cached by one of the plurality of first flip-flops at a first time and the data value cached by the third flip-flop at the first time;
   a fourth flip-flop, configured to cache the first calculation logic value according to the plurality of rising edges of the clock signal; and
   a second logic gate, configured to calculate a first validation logic value as the first checking result signal, according to the first calculation logic value and the data value cached by another one of the plurality of first flip-flops at a second time after the first time.

4. The semiconductor chip of claim 2, wherein the at least one sequence checking circuit further comprises:
   a first latch circuit, coupled between the shift register circuit and the output terminal logic gate and configured to selectively output the first checking result signal to the output terminal logic gate according to a control signal.

5. The semiconductor chip of claim 1, wherein the at least one test data signal comprises the plurality of data values, and the at least one sequence checking circuit is configured to check each of the plurality of data values at least twice according to the clock signal.

6. The semiconductor chip of claim 5, wherein the at least one sequence checking circuit comprises:
   the shift register circuit, configured to check the plurality of data values of the at least one test data signal according to the plurality of rising edges and the plurality of falling edges of the clock signal, so as to output the first checking result signal and a second checking result signal; and the output terminal logic gate, configured to output the at least one test result signal according to the voltage level of the first checking result signal and a voltage level of the second checking result signal.

7. The semiconductor chip of claim 6, wherein the shift register circuit comprises:
a plurality of first flip-flops, connected in series and configured to sequentially cache odd term of the plurality of data values according to the plurality of rising edges of the clock signal;
a plurality of second flip-flops, connected in series and configured to sequentially cache even term of the plurality of data values according to the plurality of falling edges of the clock signal;
a third flip-flop, configured to cache the data value cached by one of the plurality of second flip-flops according to the plurality of rising edges of the clock signal;
a first logic gate, configured to calculate a first calculation logic value according to the data value cached by one of the plurality of first flip-flops at a first time and the data value cached by the third flip-flop at the first time;
a fourth flip-flop, configured to cache the first calculation logic value according to the plurality of rising edges of the clock signal;
a second logic gate, configured to calculate a first validation logic value as the first checking result signal, according to the first calculation logic value and the data value cached by another one of the plurality of first flip-flops at a second time after the first time;
a fifth flip-flop, configured to cache the data value cached by the one of the plurality of first flip-flops according to the plurality of falling edges of the clock signal;
a third logic gate, configured to calculate a second calculation logic value according to the data value cached by the one of the plurality of second flip-flops at a third time and the data value cached by the fifth flip-flop at the third time;
a sixth flip-flop, configured to cache the second calculation logic value according to the plurality of falling edges of the clock signal; and
a fourth logic gate, configured to calculate a second validation logic value as the second checking result signal, according to the second calculation logic value and the data value cached by another one of the plurality of second flip-flops at a fourth time after the third time.

8. The semiconductor chip of claim 6, wherein the at least one sequence checking circuit further comprises:
a first latch circuit, coupled between the shift register circuit and a first input terminal of the output terminal logic gate and configured to selectively output the first checking result signal to the output terminal logic gate according to a control signal; and
a second latch circuit, coupled between the shift register circuit and a second input terminal of the output terminal logic gate and configured to selectively output the second checking result signal to the output terminal logic gate according to the control signal.

9. The semiconductor chip of claim 1, wherein the processing circuit determines that the at least one signal transmission path is functioning properly according to the at least one test result signal having a first voltage level,
wherein the processing circuit determines that the at least one signal transmission path is not functioning properly according to the at least one test result signal having a second voltage level, wherein the second voltage level is different from the first voltage level.

10. The semiconductor chip of claim 1, wherein the semiconductor chip further comprises a memory circuit, and the memory circuit is configured to be electrically coupled to the physical layer.

11. The semiconductor chip of claim 10, wherein the semiconductor chip further comprises an interposer, and the physical layer and the memory circuit are coupled to each other through the interposer.

12. A sequence checking circuit, configured to check a test data signal transmitted through a signal transmission path of a physical layer, and comprising:
a shift register circuit, configured to check each of a plurality of data values of the test data signal once according to a plurality of rising edges and a plurality of falling edges of a clock signal, so as to output a first checking result signal; and
an output terminal logic gate, configured to receive the first checking result signal to output a test result signal, wherein the test result signal is configured to indicate an operation status of the signal transmission path.

13. The sequence checking circuit of claim 12, wherein the shift register circuit comprises:
a plurality of first flip-flops, connected in series and configured to sequentially cache odd term of the plurality of data values according to the plurality of rising edges of the clock signal;
a plurality of second flip-flops, connected in series and configured to sequentially cache even term of the plurality of data values according to the plurality of falling edges of the clock signal;
a third flip-flop, configured to cache the data value cached by one of the plurality of second flip-flops according to the plurality of rising edges of the clock signal;
a first logic gate, configured to calculate a first calculation logic value according to the data value cached by one of the plurality of first flip-flops at a first time and the data value cached by the third flip-flop at the first time;
a fourth flip-flop, configured to cache the first calculation logic value according to the plurality of rising edges of the clock signal; and
a second logic gate, configured to calculate a first validation logic value as the first checking result signal, according to the first calculation logic value and the data value cached by another one of the plurality of first flip-flops at a second time after the first time.

14. The sequence checking circuit of claim 12, wherein the sequence checking circuit further comprises:
a first latch circuit, coupled between the shift register circuit and the output terminal logic gate and configured to selectively output the first checking result signal to the output terminal logic gate according to a control signal,
wherein the output terminal logic gate is further configured to output the test result signal according to a voltage level of the first checking result signal.

15. The sequence checking circuit of claim 12, wherein the shift register circuit is further configured to check each of the plurality of data values of the test data signal once again according to the plurality of rising edges and the plurality of falling edges of the clock signal, so as to output a second checking result signal.

16. The sequence checking circuit of claim 15, wherein the shift register circuit comprises:

a plurality of first flip-flops, connected in series and configured to sequentially cache odd term of the plurality of data values according to the plurality of rising edges of the clock signal;

a plurality of second flip-flops, connected in series and configured to sequentially cache even term of the plurality of data values according to the plurality of falling edges of the clock signal;

a third flip-flop, configured to cache the data value cached by one of the plurality of second flip-flops according to the plurality of rising edges of the clock signal;

a first logic gate, configured to calculate a first calculation logic value according to the data value cached by one of the plurality of first flip-flops at a first time and the data value cached by the third flip-flop at the first time;

a fourth flip-flop, configured to cache the first calculation logic value according to the plurality of rising edges of the clock signal;

a second logic gate, configured to calculate a first validation logic value as the first checking result signal, according to the first calculation logic value and the data value cached by another one of the plurality of first flip-flops at a second time after the first time;

a fifth flip-flop, configured to cache the data value cached by the one of the plurality of first flip-flops according to the plurality of falling edges of the clock signal;

a third logic gate, configured to calculate a second calculation logic value according to the data value cached by the one of the plurality of second flip-flops at a third time and the data value cached by the fifth flip-flop at the third time;

a sixth flip-flop, configured to cache the second calculation logic value according to the plurality of falling edges of the clock signal; and a fourth logic gate, configured to calculate a second validation logic value as the second checking result signal, according to the second calculation logic value and the data value cached by another one of the plurality of second flip-flops at a fourth time after the third time.

17. The sequence checking circuit of claim 16, wherein the first logic gate and the third logic gate are XOR gates, and the second logic gate and the fourth logic gate are XNOR gates.

18. The sequence checking circuit of claim 15, wherein the sequence checking circuit further comprises:
a first latch circuit, coupled between the shift register circuit and a first input terminal of the output terminal logic gate and configured to selectively output the first checking result signal to the output terminal logic gate according to a control signal; and a second latch circuit, coupled between the shift register circuit and a second input terminal of the output terminal logic gate and configured to selectively output the second checking result signal to the output terminal logic gate according to the control signal, wherein the output terminal logic gate is further configured to output the test result signal according to a voltage level of the first checking result signal and a voltage level of the second checking result signal.

19. The sequence checking circuit of claim 12, wherein the output terminal logic gate is a NAND gate.

\* \* \* \* \*